(12) United States Patent
Asaoka et al.

(10) Patent No.: US 12,004,362 B2
(45) Date of Patent: Jun. 4, 2024

(54) DISPLAY DEVICE AND DISPLAY DEVICE MANUFACTURING METHOD

(71) Applicant: SHARP KABUSHIKI KAISHA, Sakai (JP)

(72) Inventors: Yasushi Asaoka, Sakai (JP); Shigeru Aomori, Sakai (JP); Tsuyoshi Kamada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 318 days.

(21) Appl. No.: 17/761,090

(22) PCT Filed: Sep. 20, 2019

(86) PCT No.: PCT/JP2019/037005
§ 371 (c)(1),
(2) Date: Mar. 16, 2022

(87) PCT Pub. No.: WO2021/053814
PCT Pub. Date: Mar. 25, 2021

(65) Prior Publication Data
US 2022/0344611 A1   Oct. 27, 2022

(51) Int. Cl.
| | | |
|---|---|---|
| H01L 51/50 | (2006.01) |
| H01L 27/32 | (2006.01) |
| H10K 50/115 | (2023.01) |
| H10K 50/15 | (2023.01) |
| H10K 59/12 | (2023.01) |
| H10K 102/00 | (2023.01) |

(52) U.S. Cl.
CPC .......... *H10K 50/15* (2023.02); *H10K 50/115* (2023.02); *H10K 59/12* (2023.02); *H10K 2102/331* (2023.02)

(58) Field of Classification Search
CPC ................ H01L 51/5056; H01L 27/3244; H01L 51/502
See application file for complete search history.

(56) References Cited

U.S. PATENT DOCUMENTS

| | | | |
|---|---|---|---|
| 2016/0163988 A1 | 6/2016 | Carroll | |
| 2021/0036253 A1* | 2/2021 | Asaoka | H10K 50/115 |
| 2022/0344610 A1* | 10/2022 | Asaoka | H05B 33/14 |

FOREIGN PATENT DOCUMENTS

| | | |
|---|---|---|
| JP | 2010-009995 A | 1/2010 |
| JP | 2010-055900 A | 3/2010 |

* cited by examiner

*Primary Examiner* — Joseph L Williams
(74) *Attorney, Agent, or Firm* — ScienBiziP, P.C.

(57) ABSTRACT

A display device includes a first electrode, a second electrode, a light-emitting layer provided between the first electrode and the second electrode, and a charge transport layer provided between the first electrode and the second electrode and containing a charge transport material configured to transport a charge to the light-emitting layer. At least one layer of the light-emitting layer and the charge transport layer is a function layer including a nanofiber and a photosensitive material.

20 Claims, 14 Drawing Sheets

DISPLAY DEVICE AND DISPLAY DEVICE MANUFACTURING METHOD

TECHNICAL FIELD

The disclosure relates to a display device and a display device manufacturing method.

BACKGROUND ART

PTL 1 discloses an ejection liquid including quantum dots, which are tiny particles, and a dispersion medium in which the quantum dots are dispersed, an ejection liquid set, a thin film pattern forming method, a thin film, a light-emitting element, an image display device, and an electronic device.

CITATION LIST

Patent Literature

PTL 1: JP 2010-009995 A

SUMMARY

Technical Problem

In general, because the properties of the quantum dots (QD) vary depending on the ligand, a ligand suitable for a quantum dot light emitting diode (QLED) is selected. The solvent (dispersion medium) is also limited by the ligand. However, in a case of the solvent having too low viscosity, an applying method that can be used during film formation is limited.

Solution to Problem

A display device according to an aspect of the disclosure includes: a first electrode; a second electrode; a light-emitting layer provided between the first electrode and the second electrode; and a charge transport layer provided between the first electrode and the second electrode and containing a charge transport material configured to transport a charge to the light-emitting layer, wherein at least one layer of the light-emitting layer and the charge transport layer is a function layer including a nanofiber and a photosensitive material.

Further, a manufacturing method for a display device according to an aspect of the disclosure includes: applying a solution including a nanofiber, a photosensitive material, and a light-emitting material or a charge transport material; and performing photolithography on a layer formed as a film by the applied solution to form a function layer including the light-emitting material or the charge transport material.

Advantageous Effects of Disclosure

An aspect of the disclosure is to adjust viscosity of a solvent that is too low during application to an optimal range.

DESCRIPTION OF EMBODIMENTS

Hereinafter, "the same layer" means that the layer is formed in the same process (film formation process) as the layer to compare, "a lower layer" means that the layer is formed in an earlier process than the process in which the layer to compare is formed, and "an upper layer" means that the layer is formed in a later process than the process in which the layer to compare is formed.

First Embodiment

Figure 1:
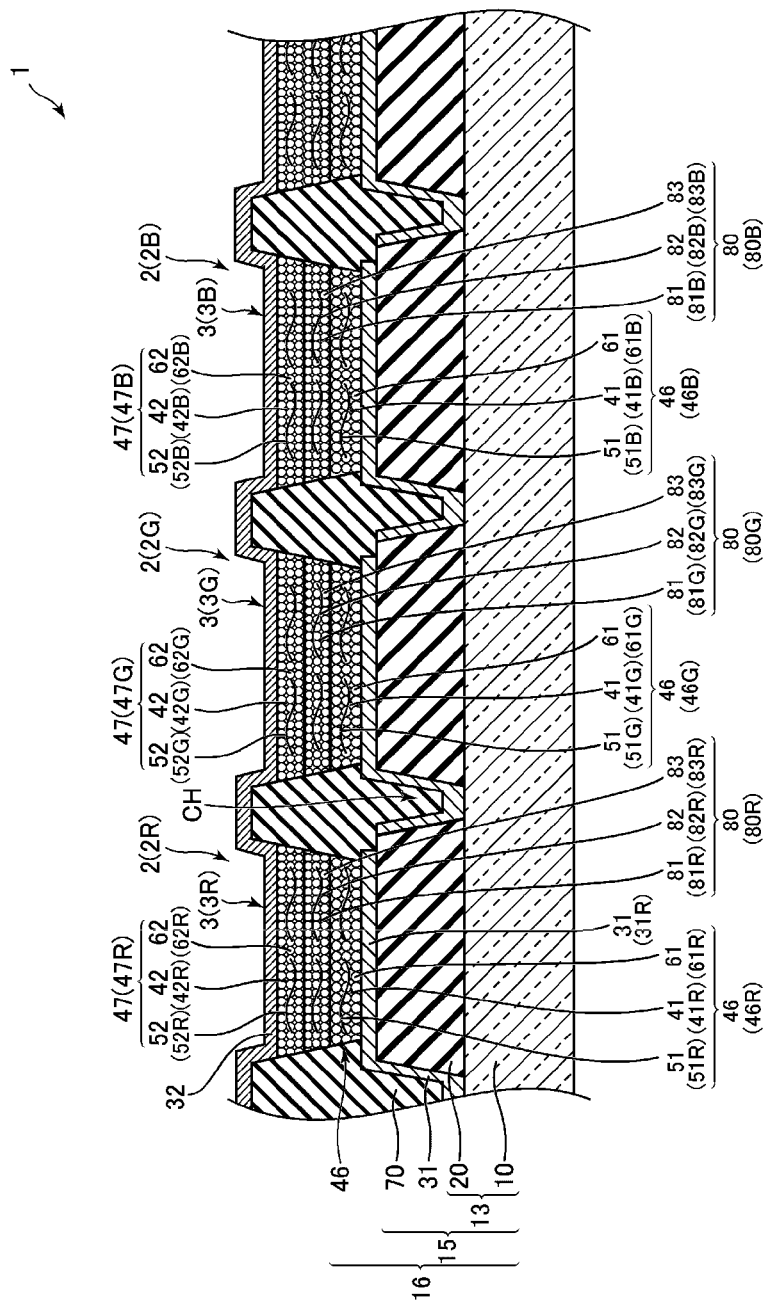
FIG. 1 is a cross-sectional view illustrating a general configuration of a display device according to a first embodiment.

FIG. 1 is a cross-sectional view illustrating a general configuration of a display device 1 according to the present embodiment. The display device 1 is used in a display of a television, a smartphone, and the like, for example. As illustrated in FIG. 1, the display device 1 according to the present embodiment includes a plurality of pixels 2 provided on an array substrate 10.

The plurality of pixels 2 include a blue pixel (first pixel) 2B that emits blue light (light of a first color), a green pixel (second pixel) 2G that emits green light (light of a second color), and a red pixel (third pixel) 2R that emits red light (light of a third color). As an example, in a plan view, the green pixel 2G is adjacent to the red pixel 2R. Further, in the plan view, the blue pixel 2B is adjacent to the green pixel 2G. Note that an order in which the red pixel 2R, the green pixel 2G, and the blue pixel 2B are arranged can be arbitrarily changed.

Each of the plurality of pixels 2 is configured by forming a light-emitting element 3 (a light-emitting element 3B, a light-emitting element 3G, and a light-emitting element 3R in the blue pixel 2B, the green pixel 2G, and the red pixel 2R, respectively) in a region divided by a bank 70 (pixel regulating layer) that has insulating properties and is provided on the array substrate 10. Note that the blue light refers to light having a light-emitting central wavelength in a wavelength band of greater than or equal to 400 nm and less than or equal to 500 nm. Further, the green light refers to light having a light-emitting central wavelength in a wavelength band of greater than 500 nm and less than or equal to 600 nm. Further, the red light refers to light having a light-emitting central wavelength in a wavelength band of greater than 600 nm and less than or equal to 780 nm.

The array substrate 10 is a substrate provided with a TFT being a thin film transistor for controlling light emission and non-light emission of each of the light-emitting elements 3. The array substrate 10 according to the present embodiment is configured by forming the TFT on a resin layer having flexibility. Further, the resin layer according to the present embodiment is configured by layering an inorganic insulating film (for example, a silicon oxide film, a silicon nitride film, or a silicon oxynitride film) that is a barrier layer on the resin film (for example, a polyimide film). However, the array substrate 10 may be configured by forming the TFT on a rigid substrate such as a glass substrate. Further, an interlayer insulating film 20 (flattening film) is provided on an upper face of the array substrate 10 according to the present embodiment. The interlayer insulating film 20 is formed of, for example, a polyimide and an acrylic material. A plurality of contact holes CH are formed on the interlayer insulating film 20. Note that, in the following description, the array substrate 10 and the interlayer insulating film 20 formed on the upper face of the array substrate 10 may be referred to as a substrate 13.

Each of the light-emitting element 3B, the light-emitting element 3G, and the light-emitting element 3R includes a first electrode 31, a first charge transport layer 46, a light-emitting layer 80, a second charge transport layer 47, and a second electrode 32.

Here, a layer including a nanofiber and a photosensitive material is referred to as a function layer. The function layer can be applied by an applying method such as a slit coating method, and furthermore, is a layer that can be patterned by photolithography and the like. In the present embodiment, each of the first charge transport layer 46, the light-emitting layer 80, and the second charge transport layer 47 is the function layer, and includes the nanofiber and the photosensitive material as described below. Note that at least one layer of the first charge transport layer 46, the light-emitting layer 80, and the second charge transport layer 47 may be the function layer (i.e., the layer including the nanofiber and the photosensitive material).

In the present embodiment, as an example, the light-emitting element 3B provided in the blue pixel 2B includes a first electrode (first pixel electrode) 31B, a first charge transport layer (function layer, first function layer) 46B overlapping the first electrode 31B, a light-emitting layer (function layer, first function layer) 80B overlapping the first charge transport layer 46B, and a second charge transport layer (function layer, first function layer) 47B overlapping the light-emitting layer 80B. Further, for example, the light-emitting element 3G provided in the green pixel 2G includes a first electrode (second pixel electrode) 31G, a first charge transport layer (function layer, second function layer) 46G overlapping the first electrode 31G, a light-emitting layer (function layer, second function layer) 80G overlapping the first charge transport layer 46G, and a second charge transport layer (function layer, second function layer) 47G overlapping the light-emitting layer 80G. The light-emitting element 3R provided in the red pixel 2R includes a first electrode (third pixel electrode) 31R, a first charge transport layer (function layer, third function layer) 46R overlapping the first electrode 31R, a light-emitting layer (function layer, third function layer) 80R overlapping the first charge transport layer 46R, and a second charge transport layer (function layer, third function layer) 47R overlapping the light-emitting layer 80R.

Note that the first electrode 31B, the first electrode 31G, and the first electrode 31R are simply referred to as the first electrode 31 when making no distinction. Further, the first charge transport layer 46B, the first charge transport layer 46G, and the first charge transport layer 46R are simply referred to as the first charge transport layer 46 when making no distinction. Further, the second charge transport layer 47B, the second charge transport layer 47G, and the second charge transport layer 47R are simply referred to as the second charge transport layer 47 when making no distinction.

The first electrode 31 injects a charge into the first charge transport layer 46. The first electrode 31 according to the present embodiment functions as an anode electrode that injects a positive hole into the first charge transport layer 46. As illustrated in FIG. 1, the first electrode 31 according to the present embodiment is provided in an island shape for each region in which each pixel 2 is formed on the interlayer insulating film 20. Then, the first electrode 31 is electrically connected to the TFT via the contact hole CH provided in the interlayer insulating film 20. The first electrode 31 includes a structure in which a metal including Al, Cu, Au, Ag, or the like having high reflectivity of visible light, and ITO, IZO, ZnO, AZO, BZO, or the like being a transparent material are layered in this order on the array substrate 10, for example. The first electrode 31 is formed by, for example, sputtering, vapor deposition, or the like.

The bank 70 is formed so as to cover the contact hole CH. The bank 70 is formed by, for example, patterning by photolithography after applying an organic material such as a polyimide and an acrylic on the array substrate 10. Further, as illustrated in FIG. 1, the bank 70 according to the present embodiment is formed so as to cover an edge of the first electrode 31. In other words, the bank 70 according to the present embodiment also functions as an edge cover of the first electrode 31. With such a configuration, generation of an excessive electric field at an edge portion of the first electrode 31 can be suppressed. Note that, in the following description, the substrate 13 (the array substrate 10 and the interlayer insulating film 20) and the first electrode 31 and the bank 70 that are formed on the substrate 13 may be referred to as a substrate 15.

The first charge transport layer 46 further transports the charge injected from the first electrode 31 to the light-emitting layer 80. The first charge transport layer 46 according to the present embodiment functions as a hole transport layer for transporting the positive hole to the light-emitting layer 80. The first charge transport layer 46 is formed on the first electrode 31, and is electrically connected to the first electrode 31. Specifically, the first charge transport layer 46 is formed in an island shape for each region defining the pixel 2.

The first charge transport layer 46 includes a photosensitive resin 41 including a photosensitive material, and a first charge transport material and a nanofiber 51 that are dispersed in the photosensitive resin 41. The first charge transport material according to the present embodiment is formed of a nanoparticle 61. In other words, the first charge transport layer 46B includes a photosensitive resin 41B including a first photosensitive material, and a nanoparticle (first nanoparticle) 61B and a nanofiber (first nanofiber) 51B that are dispersed in the photosensitive resin 41B. The first charge transport layer 46G includes a photosensitive resin 41G including a second photosensitive material, and a nanoparticle (second nanoparticle) 61G and a nanofiber (second nanofiber) 51G that are dispersed in the photosensitive resin 41G. The first charge transport layer 46R includes a photosensitive resin 41R including a third photosensitive material, and a nanoparticle (third nanoparticle) 61R and a nanofiber (third nanofiber) 51R that are dispersed in the photosensitive resin 41R.

Examples of a material constituting the nanoparticle 61 include, for example, a metal oxide having hole transport properties such as $NiO$, $Cr_2O_3$, $LaNiO_3$, $MoO_3$, and $WO_3$. As the photosensitive resin 41, either a positive-working photoresist or a negative-working photoresist may be used. The first charge transport layer 46 is formed by, for example, an applying method such as a slit coating method. Note that details of the nanofiber 51 will be described below.

Note that, in the following description, the substrate 15 (the array substrate 10, the interlayer insulating film 20, the first electrode 31, and the bank 70) and the first charge transport layer 46 formed on the substrate 15 may be referred to as a substrate 16.

The light-emitting layer 80 is provided between the first electrode 31 and the second electrode 32. Specifically, the light-emitting layer 80 according to the present embodiment is provided between the first charge transport layer 46 and the second charge transport layer 47. Further, the light-emitting layer 80 according to the present embodiment includes a photosensitive resin 81 including a photosensitive material, and a nanofiber 82 and a quantum dot 83 (semiconductor nanoparticle) that are dispersed in the photosensitive resin 81. Specifically, for example, the light-emitting layer 80B includes a photosensitive resin 81B including a first photosensitive material, a nanofiber (first nanofiber) 82B, and a quantum dot (first quantum dot) 83B. Further, the light-emitting layer 80G includes a photosensitive resin 81G including a second photosensitive material, a nanofiber (second nanofiber) 82G, and a quantum dot (second quantum dot) 83G. Further, the light-emitting layer 80R includes a photosensitive resin 81R including a third photosensitive material, a nanofiber (third nanofiber) 82R, and a quantum dot (third quantum dot) 83R.

As the photosensitive resin 81, either a positive-working photoresist or a negative-working photoresist may be used. The light-emitting layer 80 is formed by, for example, an applying method such as a slit coating method. Note that the photosensitive resins 81B, 81G, and 81R may include the photosensitive material of the same type. Further, details of the nanofiber 82 will be described below.

The quantum dot 83 is a light-emitting material that has a valence band level and a conduction band level and emits light through recombination of a positive hole at the valence band level with an electron at the conduction band level. Light emission from the quantum dot 83 matching in a particle size has a narrower spectrum due to a quantum confinement effect, and thus the light emission with a relatively deep color level can be obtained.

The quantum dot 83 may be, for example, a semiconductor nanoparticle having a core-shell structure including CdSe, InP, ZnTeSe, and ZnTeS in a core, and ZnS in a shell. In addition, the quantum dot 83 may have the core-shell structure including a combination of the core and the shell such as CdSe/CdS, InP/ZnS, ZnSe/ZnS, or CIGS/ZnS, or may have a double shell structure such as InP/ZnSe/ZnS in which the shell is multilayered. Further, for example, a ligand formed of an organic matter such as thiol and amine may have a coordination bond on an outer peripheral portion of the shell.

The particle size of the quantum dot 83 is approximately from 3 nm to 15 nm. A wavelength of the light emission from the quantum dot 83 can be controlled according to the particle size of the quantum dot 83. Thus, by controlling the particle size of each of the quantum dot 83R, the quantum dot 83G, and the quantum dot 83B, the light emission of each color can be obtained.

The second charge transport layer 47 further transports the electron injected from the second electrode 32 to the light-emitting layer 80. The second charge transport layer 47 according to the present embodiment functions as an electron transport layer for transporting the electron to the light-emitting layer 80. Further, the second charge transport layer 47 may have a function (positive hole blocking function) of suppressing transport of the positive hole to the second electrode 32. In the present embodiment, the second charge transport layer 47 is provided on the light-emitting layer 80.

The second charge transport layer 47 includes a photosensitive resin 42 including a photosensitive material, and a second charge transport material and a nanofiber 52 that are dispersed in the photosensitive resin 42. The second charge transport material according to the present embodiment is formed of a nanoparticle 62. In other words, the second charge transport layer 47B includes a photosensitive resin 41B including a first photosensitive material, and a nanoparticle (first nanoparticle) 62B and a nanofiber (first nanofiber) 52B that are dispersed in the photosensitive resin 41B. The second charge transport layer 47G includes a photosensitive resin 42G including a second photosensitive material, and a nanoparticle (second nanoparticle) 62G and a nanofiber (second nanofiber) 52G that are dispersed in the photosensitive resin 42G. The second charge transport layer 47R includes a photosensitive resin 42R including a third photosensitive material, and a nanoparticle (third nanoparticle) 62R and a nanofiber (third nanofiber) 52R that are dispersed in the photosensitive resin 42R.

Further, examples of a material constituting the nanoparticle 62 include, for example, a material having electron transport properties such as $TiO_2$, ZnO, ZAO (Al-doped ZnO), ZnMgO, ITO, and $InGaZnO_x$. As the photosensitive resin 42, either a positive-working photoresist or a negative-working photoresist may be used. The second charge transport layer 47 is formed by, for example, an applying method such as a slit coating method. Note that details of the nanofiber 52 will be described below.

Note that, in the light-emitting element 3B, the light-emitting element 3G, and the light-emitting element 3R, each of the second charge transport materials included in the second charge transport layer 47 is preferably different. Specifically, the second charge transport material included in the light-emitting element 3B is preferably an Mg-containing ZnO nanoparticle. Further, the second charge transport material included in the light-emitting element 3G is preferably an Mg-containing ZnO nanoparticle having a particle size larger than that of the second charge transport material included in the light-emitting element 3B. The second charge transport material included in the light-emitting element 3R is preferably an Mg-containing ZnO nanoparticle or a ZnO nanoparticle having a particle size larger than that of the second charge transport material included in the light-emitting element 3G.

With such a configuration, an energy level of the second charge transport layer 47 can be adjusted for each luminescent color, and luminous efficiency of each of the light-emitting elements 3 can be improved. However, in the light-emitting element 3B, the light-emitting element 3G, and the light-emitting element 3R, the second charge transport material (i.e., the nanoparticles 62B, 62G, and 62R) included in the second charge transport layer 47 may be the same material from a perspective of manufacturing ease.

The second electrode 32 is provided on the second charge transport layer 47, and is electrically connected to the second charge transport layer 47. The second electrode 32 according to the present embodiment functions as a cathode electrode that injects the electron into the second charge transport layer 47. Further, the second electrode 32 according to the present embodiment is continuously formed across the plurality of pixels 2. The second electrode 32 is formed of, for example, a metal thinned to a degree having optical transparency of visible light, and a transparent material. Examples of the metal constituting the second electrode 32 include, for example, a metal including Al, Ag, Mg, and the like. Further, examples of the transparent material constituting the second electrode 32 include, for example, an electrically conductive nanofiber such as ITO, IZO, ZnO, AZO, BZO, or a silver nanofiber. The second electrode 32 is formed by, for example, sputtering, vapor deposition, and an applying method.

Further, a sealing layer (not illustrated) is provided on the second electrode 32. The sealing layer includes, for example, an inorganic sealing film that covers the second electrode 32, an organic layer formed of an organic buffer film that is an upper layer overlying the inorganic sealing film, and an inorganic sealing film that is an upper layer overlying the organic buffer film. The sealing layer prevents penetration of foreign matters such as water and oxygen into the display device 1. Further, the inorganic sealing film is an inorganic insulating film, and can be formed of, for example, a silicon oxide film, a silicon nitride film, a silicon oxynitride film, or a layered film thereof formed by CVD. The organic buffer film is a transparent organic film having a leveled effect, and can be formed of a coatable organic material such as an acrylic. Further, a function film (not illustrated) may be provided on the sealing layer. The function film has, for example, at least one of an optical compensation function, a touch sensor function, and a protection function.

The positive hole injected from the first electrode 31 and the electron injected from the second electrode 32 are transported to the light-emitting layer 80 via the first charge transport layer 46 and the second charge transport layer 47, respectively. Then, the positive hole and the electron transported to the light-emitting layer 80 recombine in the quantum dot 83 to generate an exciton. Then, the exciton returns from an excited state to a ground state, and thus the quantum dot 83 emits light. Note that, in the display device 1 according to the present embodiment, a top-emitting type in which light emitted from the light-emitting layer 80 is extracted from an opposite side to the array substrate 10 (upward direction in FIG. 1) is exemplified. However, the display device 1 may be a bottom-emitting type in which the light is extracted from an array substrate 10 side (downward direction in FIG. 1). In this case, the second electrode 32 may be formed of a reflective electrode, and the first electrode 31 may be formed of a transparent electrode.

Further, in the display device 1 according to the present embodiment, the first electrode 31 that is the anode electrode, the first charge transport layer 46 that is the hole transport layer, the light-emitting layer 80, the second charge transport layer 47 that is the electron transport layer, and the second electrode 32 that is the cathode electrode are layered in the order from the array substrate 10. However, the display device 1 may have a so-called invert structure in which the cathode electrode, the electron transport layer, the light-emitting layer 80, the hole transport layer, and the anode electrode are layered in the order from the array substrate 10.

Figure 2:
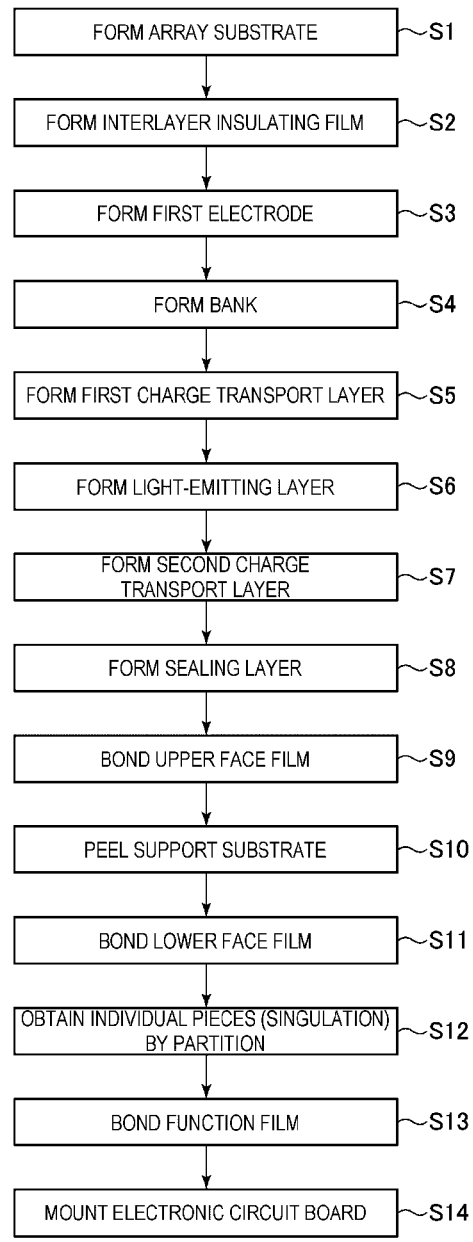
FIG. 2 is a flowchart illustrating a display device manufacturing method of the first embodiment.

FIG. 2 is a flowchart illustrating a manufacturing method for the display device 1 according to the present embodiment. Next, the manufacturing method for the display device 1 will be described.

As illustrated in FIG. 2, in order to prepare the display device 1, first, the array substrate 10 is formed (step S1). The array substrate 10 is formed by forming a resin layer on a transparent support substrate (for example, a mother glass), forming a barrier layer on the resin layer, and forming a TFT on the barrier layer. Next, the interlayer insulating film 20 is formed (step S2). Next, the first electrode 31 is formed (step S3). Next, the bank 70 is formed (step S4).

Next, the first charge transport layer 46 is formed (step S5). The first charge transport layer 46 is formed by applying a colloidal solution including at least the nanoparticle 61, the nanofiber 51, and the photosensitive material by using an applying method such as slit coating. Details of step S5 will be described below.

Next, the light-emitting layer 80 is formed (step S6). The light-emitting layer 80 is formed by applying a colloidal solution including at least the quantum dot 83, the nanofiber 82, and the photosensitive material by using an applying method such as slit coating. Details of step S6 will be described below.

Next, the second charge transport layer 47 is formed (step S7). The second charge transport layer 47 is formed by applying a colloidal solution including at least the nanoparticle 62, the nanofiber 52, and the photosensitive material by using an applying method such as slit coating. Note that step S7 is similar to step S5, and thus a detailed description will be omitted.

Next, the sealing layer is formed (step S8). Next, an upper face film is bonded onto the sealing layer (step S9). Next, the support substrate is peeled from the resin layer by irradiation with laser light and the like (step S10). Next, a lower face film is bonded to a lower face of the resin layer 12 (step S11). Next, a layered body in which each layer is layered is partitioned, and a plurality of individual pieces are obtained (step S12). Next, a function film is bonded to the obtained individual pieces (step S13). Subsequently, an electronic circuit board (for example, an IC chip and an FPC) is mounted on a portion (terminal portion) located outward (a non-display region, frame) from a display region in which the plurality of pixels 2 are formed (step S14). In this way, the display device 1 according to the present embodiment can be manufactured. Note that steps S1 to S13 are performed by a manufacturing apparatus of the display device (including a film formation apparatus configured to perform each of steps S1 to S5).

Note that the flexible display device 1 is described above, but when manufacturing a non-flexible display device 1, formation of a resin layer, replacement of a base material, and the like are not required in general. Thus, for example, a layering step of steps S2 to S7 is performed on the array substrate 10 that is the glass substrate, and subsequently, processing proceeds to step S11.

Figure 3:
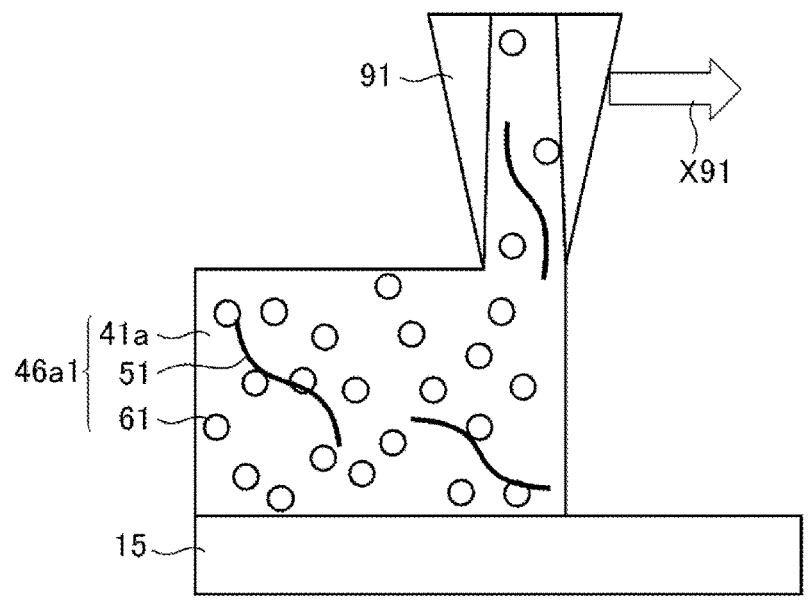
FIG. 3 is a diagram illustrating a state in which a colloidal solution to become a first charge transport layer is applied in a display device manufacturing step according to the first embodiment.
Figure 4:
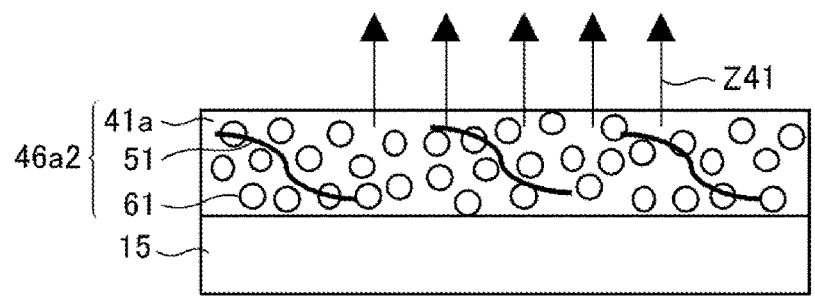
FIG. 4 is a diagram illustrating a state in which a solvent of the colloidal solution illustrated in FIG. 3 is evaporated.
Figure 5:
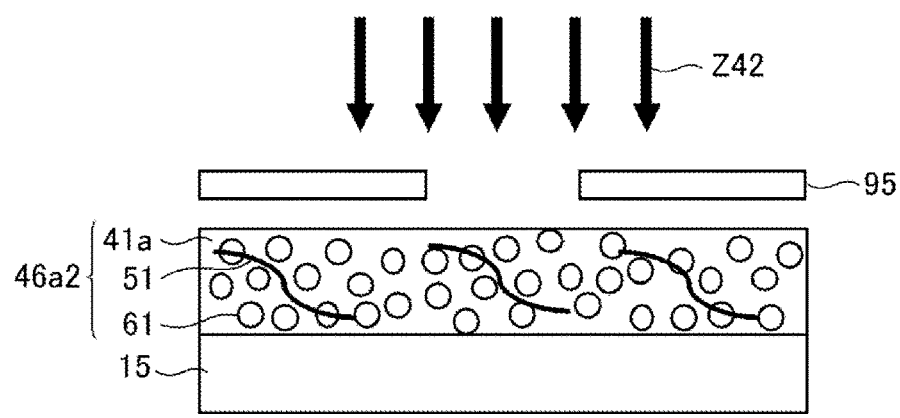
FIG. 5 is a diagram illustrating a state in which the first charge transport layer formed as a film by evaporating the solvent illustrated in FIG. 3 is exposed.
Figure 6:
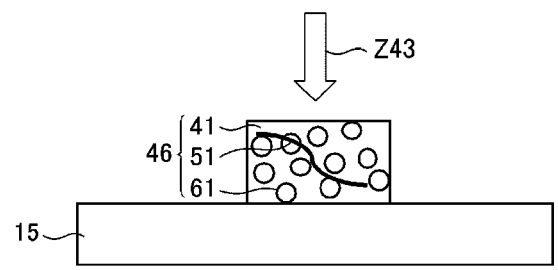
FIG. 6 is a diagram illustrating a state in which the first charge transport layer illustrated in FIG. 5 is patterned by development.

Next, details of the step of forming the first charge transport layer 46 (the step of step S5) will be described with reference to FIGS. 3 to 6. FIG. 3 is a diagram illustrating a state in which a colloidal solution 46a1 to become the first charge transport layer 46 is applied. FIG. 4 is a diagram illustrating a state in which a solvent (dispersion medium) 41a of the colloidal solution 46a1 illustrated in FIG. 3 is evaporated. FIG. 5 is a diagram illustrating a state in which a first charge transport layer 46a2 formed as a film by evaporating the solvent 41a is exposed. FIG. 6 is a diagram illustrating a state in which the exposed first charge transport layer 46a2 is patterned by development.

As illustrated in FIG. 3, the colloidal solution 46a1 for forming the first charge transport layer 46 includes the solvent 41a containing the photosensitive material, and the nanoparticle 61 and the nanofiber 51 that are dispersed in the solvent 41a.

The colloidal solution 46a1 is applied from a head 91 while moving the head 91 of a slit coater in an arrow X91 direction relatively to the substrate 15 prepared through steps S1 to S5. In this way, the colloidal solution 46a1 is continuously applied to the entire surface of the substrate 15 such that, for example, a thickness is approximately greater than or equal to 20 nm and less than or equal to 100 nm.

Viscosity of the colloidal solution 46a1 at room temperature (from 20° C. to 25° C.) is preferably greater than or equal to 2 mPa·s and less than or equal to 100 mPa·s, and more preferably greater than or equal to 2 mPa·s and less than or equal to 10 mPa·s. In this way, the colloidal solution 46a1 can be more suitably applied (ejected) by an applying method such as a slit coating method.

Examples of the solvent 41a for forming the colloidal solution 46a1 include, for example, an organic solvent such as methyl alcohol, ethyl alcohol, hexane, methyl ethyl ketone (MEK), ethyl acetate, chloroform, tetrahydrofuran (THF), benzene, chlorobenzene, 1,2-dichlorobenzene, toluene, propylene glycol monomethyl ether acetate (PGMEA), and N-methyl pyrrolidone (NMP), or water. In the present embodiment, since the viscosity of the colloidal solution 46a1 can be adjusted by the nanofiber 51, a degree of freedom in selection of the solvent 41a can be increased, and even a solvent that, in general, has low viscosity and cannot be applied by an applying method such as a slit coating method can be used.

Specifically, for example, the viscosity of ethyl alcohol at 20° C. is 1.200 mPa·s, the viscosity of methyl ethyl ketone at 20° C. is 0.40 mPa·s, the viscosity of chlorobenzene at 20° C. is 0.8 mPa·s, the viscosity of 1,2-dichlorobenzene at 25° C. is 1.324 mPa·s, the viscosity of toluene at 20° C. is 0.5866 mPa·s, the viscosity of water at 20° C. is 1.002 mPa·s, and none are suitable for application by slit coating. However, even with these solvents, by adding the nanofiber 51, the viscosity of the colloidal solution 46a1 at room temperature (from 20° C. to 25° C.) can be adjusted (thickened) to greater than or equal to 2 mPa·s and less than or equal to 100 mPa·s. Note that the amount of the nanoparticle 61 in the colloidal solution 46a1 is suitably approximately several wt. % from a perspective of charge transport properties.

Here, the nanofiber 51 acts as a viscosity adjusting agent (thickener) of the colloidal solution 46a1, and adjusts the colloidal solution 46a1 to the viscosity suitable for slit coating. In other words, the nanofiber 51 has a high viscosity thickening characteristic, and the viscosity (viscosity) and thixotropy of the colloidal solution 46a1 can be controlled by adding the nanofiber 51.

Next, as illustrated in FIG. 4, the substrate 15 having the surface to which the colloidal solution 46a1 is applied is prebaked by being inserted into a furnace and the like. In this way, as indicated by an arrow Z41, the solvent 41a in the colloidal solution 46a1 on the substrate 15 is evaporated, and the photosensitive resin 41 being a continuous film is formed as a film on the entire surface of the substrate 15. In other words, the first charge transport layer 46a2 in which the nanofiber 51 and the nanoparticle 61 are dispersed in the photosensitive resin 41 on the substrate 15 is formed on the entire surface of the substrate 15. In prebaking, for example, heat at approximately greater than or equal to 80° C. and less than or equal to 120° C. is added to the substrate 15 and the colloidal solution 46a1.

Here, since the nanofiber 51 is dispersed in the first charge transport layer 46, the photosensitive resin 41 can be formed as a film by suppressing non-uniform aggregation of the nanoparticle 61 as compared with a case in which the nanofiber 51 is not dispersed.

Next, as illustrated in FIG. 5, the first charge transport layer 46a2 formed as a film on the entire surface of the substrate 15 is subjected to exposure (hereinafter referred to as UV exposure) using ultraviolet (UV) light through a mask 95 as indicated by an arrow Z42. The UV exposure is performed by, for example, irradiation with the UV light of approximately from 10 to 1000 mJ/cm$^2$.

Next, as illustrated in FIG. 6, the first charge transport layer 46a2 (see FIG. 5) formed on the entire surface of the substrate 15 is developed as indicated by an arrow Z43, and thus the first charge transport layer 46 is patterned on the substrate 15 for each pixel 2. The development is performed by using an alkaline solution, an organic solvent, and water, for example. When the positive-working photoresist is used as the photosensitive resin 41 in the first charge transport layer 46, a portion irradiated with the UV light through the mask 95 is dissolved to be removed by the development. When the negative-working photoresist is used, a portion other than the portion irradiated with the UV light through the mask 95 is dissolved to be removed by the development.

Subsequently, the substrate 15 on which the first charge transport layer 46 is patterned is inserted into a furnace, and the like to be subjected to main baking as necessary. By performing main baking, emission of gas from the photosensitive resin 41 in the first charge transport layer 46 can be suppressed when the display device 1 emits light. In main baking, for example, heat at approximately higher than or equal to 100° C. and lower than or equal to 200° C. is applied to the substrate 15 and the first charge transport layer 46. In this way, the step of step S5 ends. Note that the step of step S7 is also similar to the step of step S5.

In this way, by adding the nanofiber 51 to the colloidal solution 46a1 including the nanoparticle 61 and the solvent 41a, the colloidal solution 46a1 can be applied by an applying method such as a slit coating method regardless of the viscosity of the solvent 41a. Further, since the colloidal solution 46a1 contains the photosensitive material, the first charge transport layer 46 can be patterned by the exposure and the development (i.e., the photolithography method) after drying the colloidal solution 46a1. Thus, the first charge transport layer 46 being uniform with suppressed unevenness in thickness and suppressed cracking can be formed.

Here, a diameter of the nanofiber 51 included in the first charge transport layer 46 is preferably smaller than a thickness of the first charge transport layer 46 (typically from 5 to 30 nm). Thus, a diameter from 3 to 30 nm is suitable, a diameter smaller than a diameter of the nanoparticle 61 is more preferable, and a diameter as small as possible is even more preferable. When the diameter of the nanofiber 51 exceeds 30 nm, unevenness readily occurs on a surface of the first charge transport layer 46, and flatness of an interface decreases, and thus light-emission characteristics may decrease. Further, when the diameter of the nanofiber 51 exceeds 30 nm, a region in which the nanoparticle 61 is not present in a film thickness direction of the first charge transport layer 46 may be formed.

Further, a length of the nanofiber 51 included in the first charge transport layer 46 is suitably greater than the diameter of the nanoparticle 61, is more preferably greater than or equal to twice the thickness of the first charge transport layer 46 and less than or equal to 1 μm, and is even more preferably from 60 nm to 1 μm, which is sufficiently greater than the thickness. When the length of the nanofiber 51 is less than twice the thickness of the first charge transport layer 46, it is difficult for the nanofiber 51 to be arranged in parallel (horizontally) in the surface of the first charge transport layer 46, and thus the unevenness readily occurs on the surface of the first charge transport layer 46. When the length of the nanofiber 51 is greater than 1 μm, a risk that clogging occurs in a nozzle of the head 91 during application by a slit coater is increased. Further, patterning of the first charge transport layer 46 to be formed may be degraded.

The colloidal solution 46a1 can be suitably applied by a slit coating method by controlling the diameter and the length of the nanofiber 51 to be the diameter and the length described above.

Note that, in the present specification, a relationship between the nanoparticle 61 and the nanofiber 51, and the like are described by using "diameter" as an indicator. Here, in a case of the nanoparticle 61, the "diameter" is a diameter assuming that the nanoparticle 61 is a true sphere. Further, for the "diameter" of the nanofiber 51, a cross-section of the nanofiber 51 is assumed to be a true circle. However, in practice, there are the nanoparticle 61 that is not regarded as the true sphere and the nanofiber 51 in which the cross-section is not regarded as the true circle. However, even when the nanoparticle 61 has some distortions from the true sphere, the nanoparticle 61 can perform substantially the same function as the nanoparticle 61 of the true sphere. Further, even when the cross-section of the nanofiber 51 is an elliptic shape or a strip shape having a distortion, the nanofiber 51 can perform substantially the same function as the nanofiber 51 in which the cross-section is the true circle. Therefore, the "diameter" in the present specification refers to a diameter when the nanoparticle 61 is converted to the nanoparticle 61 of the true sphere of the same volume for the nanoparticle 61, and refers to a maximum width for the nanofiber 51.

Further, the number of the nanoparticles 61 included in the first charge transport layer 46 is preferably greater than the number of the nanofibers 51. Specifically, a number ratio of the nanofibers 51 to the nanoparticles 61 (nanofibers 51:nanoparticles 61) is more preferably from 1:100 to 1:100000000, and even more preferably from 1:10000 to 1:10000000. By controlling the number ratio of the nanoparticles 61 and the nanofibers 51 in this manner, an excellent charge transport layer can be formed.

Further, the amount of the nanofiber 51 in the colloidal solution 46a1 is preferably greater than 0 and less than or equal to 1 wt. %, and is preferably as low as possible while still affording a viscosity increasing effect such that the viscosity of the colloidal solution 46a1 at room temperature (from 20° C. to 25° C.) is greater than or equal to 2 mPa·s and less than or equal to 100 mPa·s. When the amount of the nanofiber 51 exceeds 1 wt. %, the viscosity of the colloidal solution 46a1 becomes too high, making the colloidal solution 46a1 difficult to suitably apply by a slit coating method, and thus this may make it difficult to form a thin film. Further, the amount of the nanoparticle 61 included in the first charge transport layer 46 relatively decreases, and thus light-emission characteristics may decrease. Note that, when the amount of the nanofiber 51 is too small, the viscosity increasing effect cannot be obtained.

The nanofiber 51 is not particularly limited as long as the nanofiber 51 is transparent, has optical transparency of visible light, and has insulating properties, but is suitably a polysaccharide polymer (polysaccharide) in a straight chain. By modifying the polysaccharide polymer with a hydrophobic group, it can be readily and stably dispersed in an organic solvent. The nanofiber 51 is more preferably a cellulose nanofiber in which glucose is a polysaccharide linked in a straight chain, a chitin nanofiber in which acetylglucosamine is a polysaccharide linked in a straight chain, and a lambda carrageenan used as a thickener for food products, even more preferably a cellulose nanofiber, and particularly preferably a TEMPO-oxidized cellulose nanofiber. A plurality of types of the nanofibers 51 may be used in combination as necessary. Note that a molecule structure of a terminal end of the nanofiber 51 differs depending on whether the nanofiber 51 is dispersed in water or dispersed in an organic solvent.

The cellulose nanofiber can be readily and stably dispersed in water or an organic solvent, such as methyl alcohol, methyl ethyl ketone (MEK), ethyl acetate, toluene, and the like. The chitin nanofiber can be readily and stably dispersed in organic solvents, such as chloroform, tetrahydrofuran (THF), benzene, toluene, hexane, and the like.

The TEMPO-oxidized cellulose nanofiber is, for example, an oxidized cellulose nanofiber including a nitroxyl radical such as 2,2,6,6-tetramethylpiperidine-1-oxyradical. The TEMPO-oxidized cellulose nanofiber has, for example, a diameter of 3 nm, is transparent, is without scattering, has high insulating properties (>100 TΩ), and has a high dielectric constant (from 5 to 6 F/m).

Then, even when the colloidal solution 46a1 is applied by a slit coating method, the nanofiber 51 included in the colloidal solution 46a1 after application, that is, the nanofiber 51 included in the first charge transport layer 46 maintains a random arrangement state in an in-plane direction.

By step S5, the nanoparticle 61 is uniformly applied across the entire drip area, and is disposed three-dimensionally while the nanofiber 51 is present so as to be sewn between the nanoparticles 61, is oriented with a length direction aligned with the surface of the substrate 15, and maintains a random state in the in-plane direction. The nanofiber 51 is present in the random state in the in-plane direction so as to be sewn between the nanoparticles 61, and thus the first charge transport layer 46 being uniform without unevenness in thickness and without cracking is formed. In other words, since the first charge transport layer 46 being uniform is formed, the display device 1 can uniformly emit light.

Figure 7:
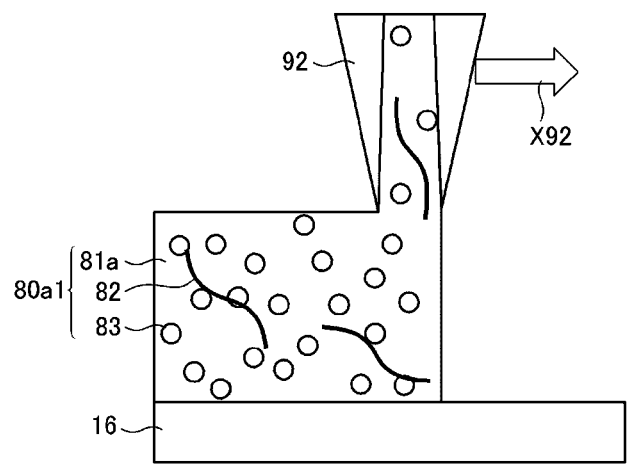
FIG. 7 is a diagram illustrating a state in which a colloidal solution to become a light-emitting layer is applied in the display device manufacturing step according to the first embodiment.
Figure 8:
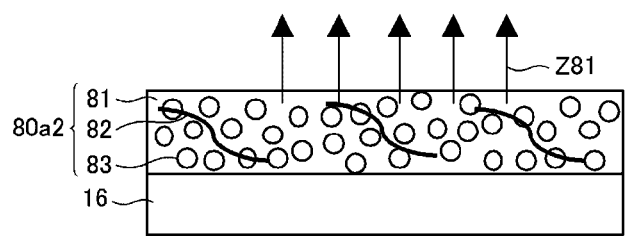
FIG. 8 is a diagram illustrating a state in which a solvent of the colloidal solution illustrated in FIG. 7 is evaporated.
Figure 9:
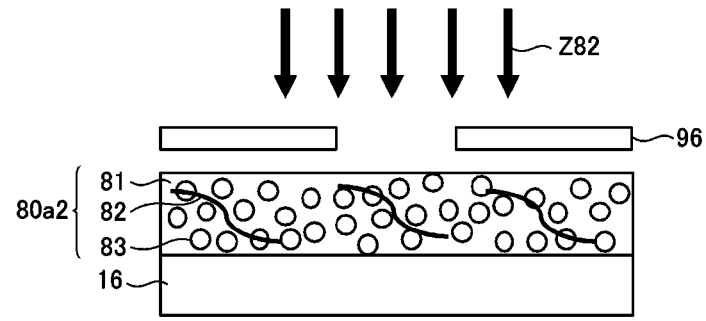
FIG. 9 is a diagram illustrating a state in which the light-emitting layer formed as a film by evaporating the solvent illustrated in FIG. 8 is exposed.
Figure 10:
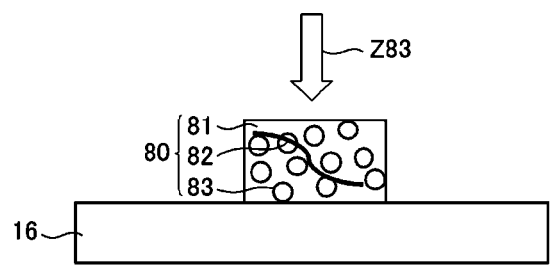
FIG. 10 is a diagram illustrating a state in which the light-emitting layer illustrated in FIG. 9 is patterned by development.

Next, details of the step of forming the light-emitting layer 80 (the step of step S6) will be described with reference to FIGS. 7 to 10. FIG. 7 is a diagram illustrating a state in which a colloidal solution 80a1 to become the light-emitting layer 80 is applied. FIG. 8 is a diagram illustrating a state in which a solvent 81a of the colloidal solution 81a1 illustrated in FIG. 7 is evaporated. FIG. 9 is a diagram illustrating a state in which a light-emitting layer 80a2 formed as a film by evaporating the solvent 81a is exposed. FIG. 10 is a diagram illustrating a state in which the exposed light-emitting layer 80a2 is patterned by development.

As illustrated in FIG. 7, the colloidal solution 80a1 for forming the light-emitting layer 80 includes the solvent (dispersion medium) 81a containing the photosensitive material, and the quantum dot 83 and the nanofiber 82 that are dispersed in the solvent 81a. The colloidal solution 80a1 may or may not include a ligand. When the colloidal solution 80a1 does not include a ligand, the solvent is not limited by the ligand. Further, the colloidal solution 80a1 preferably does not include a host material.

The same material as the solvent 41a and the nanofiber 51 can be used for the solvent 81a and the nanofiber 82.

The quantum dot 83 is, for example, a semiconductor having a fine particle shape and having a particle diameter (diameter) of from 3 to 15 nm (the number of atoms for 100 to 10000) formed of group elements of group II-VI, III-V, or IV-VI, and is used as a luminophore. The quantum dots 83 may differ from each other in material, elemental concentration, and crystal structure in a center portion and an outer shell portion. Further, the quantum dot 83 may have a different band gap in the center portion and the outer shell portion, and the band gap may be larger in the outer shell portion than in the center portion. The quantum dot 83 is dispersed in the solvent 81a, thereby forming the colloidal solution 80a1. Note that atoms and an organic molecule may be attached as a ligand to a surface of the quantum dot 83 in order to suppress aggregation of the quantum dots 83 in the colloidal solution 80a1, and to increase dispersibility and stability of the quantum dot 83. Examples of the organic molecule that is a ligand include alkylthiol, alkylamine, carboxylic acid, oleic acid, organic silane, and the like.

The colloidal solution 80a1 is applied from a head 92 while moving the head 92 of a slit coater in an arrow X92 direction relatively to an upper face of the substrate 16 in which the first charge transport layer 46 is formed on an upper face of the substrate 15 through step S6. In this way, the colloidal solution 80a1 is continuously applied to the entire surface of the substrate 16 such that, for example, a thickness is approximately greater than or equal to 20 nm and less than or equal to 100 nm.

Viscosity of the colloidal solution 80a1 at room temperature (from 20° C. to 25° C.) is preferably greater than or equal to 2 mPa·s and less than or equal to 100 mPa·s, and more preferably greater than or equal to 2 mPa·s and less than or equal to 10 mPa·s. In this way, the colloidal solution 80a1 can be more suitably applied (ejected) by an applying method such as a slit coating method.

Next, as illustrated in FIG. 8, the substrate 16 having the surface to which the colloidal solution 80a1 is applied is prebaked by being inserted into a furnace and the like. In this way, as indicated by an arrow Z81, the solvent 81a in the colloidal solution 80a1 on the substrate 16 is evaporated, and the photosensitive resin 81 being a continuous film is formed as a film on the entire surface of the substrate 16. In other words, the light-emitting layer 80a2 in which the nanofiber 82 and the quantum dot 83 are dispersed in the photosensitive resin 81 on the substrate 16 is formed on the entire surface of the substrate 16. In prebaking, for example, heat at approximately greater than or equal to 80° C. and less than or equal to 120° C. is added to the substrate 16 and the colloidal solution 80a1.

Here, since the nanofiber 82 is dispersed in the light-emitting layer 80, the photosensitive resin 81 can be formed as a film by suppressing non-uniform aggregation of the quantum dot 83 as compared with a case in which the nanofiber 82 is not dispersed.

Next, as illustrated in FIG. 9, the light-emitting layer 80a2 formed as a film on the entire surface of the substrate 16 is subjected to the ultraviolet (UV) exposure through a mask 96 as indicated by an arrow Z82. The UV exposure is performed by, for example, irradiation with the UV light of approximately from 10 to 1000 mJ/cm².

Next, as illustrated in FIG. 10, the light-emitting layer 80 (see FIG. 10) formed on the entire surface of the substrate 16 is developed as indicated by an arrow Z83, and thus the light-emitting layer 80 is patterned on the substrate 16 for each pixel 2. The development is performed by using an alkaline solution, an organic solvent, and water, for example. When the positive-working photoresist is used as the photosensitive resin 81 in the light-emitting layer 80, a portion irradiated with the UV light through the mask 96 is dissolved to be removed by the development. When the negative-working photoresist is used, a portion other than the portion irradiated with the UV light through the mask 96 is dissolved to be removed by the development.

Subsequently, the substrate 16 on which the light-emitting layer 80 is patterned is inserted into a furnace, and the like to be subjected to main baking as necessary. By performing main baking, emission of gas from the photosensitive resin 81 in the light-emitting layer 80 can be suppressed when the display device 1 emits light. In main baking, for example, heat at approximately greater than or equal to 100° C. and less than or equal to 200° C. is applied to the substrate 16 and the light-emitting layer 80. In this way, the step of step S6 ends.

In this way, by adding the nanofiber 82 to the colloidal solution 80a1 including the quantum dot 83 and the solvent 81a, the colloidal solution 80a1 can be applied by an applying method such as a slit coating method regardless of viscosity of the solvent 81a. Further, since the colloidal solution 80a1 contains the photosensitive material, the light-emitting layer 80 can be patterned by the exposure and the development (i.e., the photolithography) after drying the colloidal solution 80a1. Thus, the light-emitting layer 80 being uniform without unevenness in thickness and without cracking can be formed.

Note that the description is given on the assumption that all the layers of the first charge transport layer 46, the light-emitting layer 80, and the second charge transport layer 47 include the nanofiber and the photosensitive material, but the nanofiber and the photosensitive material may be included in at least any one layer of the first charge transport layer 46, the light-emitting layer 80, and the second charge transport layer 47. For example, the nanofiber and the photosensitive material may be included only in the first charge transport layer 46, may be included only in the light-emitting layer 80, may be included only in the second charge transport layer 47, or may be included in any two layers, among the first charge transport layer 46, the light-emitting layer 80, and the second charge transport layer 47.

Further, the nanofibers included in the first charge transport layer 46, the light-emitting layer 80, and the second charge transport layer 47 may be equal in material, i.e., formed of the same material. Further, the nanofibers included in any two layers among the first charge transport layer 46, the light-emitting layer 80, and the second charge transport layer 47 may be equal in material, i.e., formed of the same material.

Further, the nanofibers included in the first charge transport layer 46, the light-emitting layer 80, and the second charge transport layer 47 may be equal in shape. Further, the nanofibers included in any two layers among the first charge transport layer 46, the light-emitting layer 80, and the second charge transport layer 47 may have an equal shape. Note that the "nanofibers have an equal shape" can be expressed as the "nanofibers have an equal diameter and an equal length".

Second Embodiment

Next, a second embodiment will be described. Note that a difference from the first embodiment will be mainly described, and a description of contents overlapping the first embodiment will be omitted.

Figure 11:
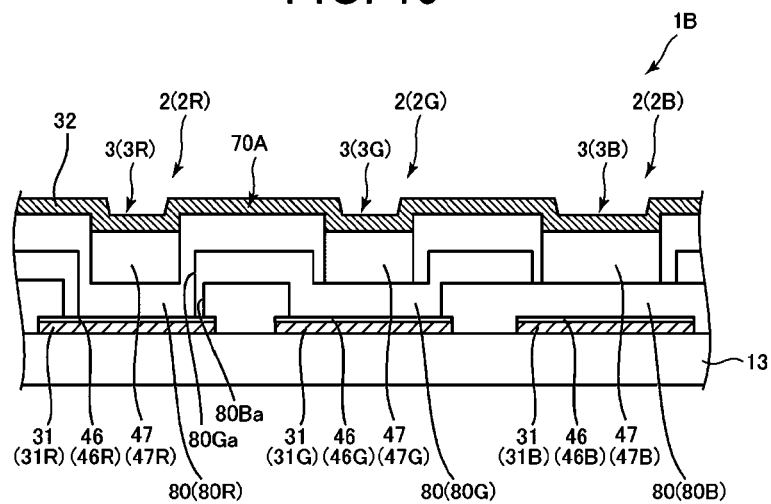
FIG. 11 is a cross-sectional view illustrating a general configuration of a display device according to a second embodiment.

FIG. 11 is a cross-sectional view illustrating a general configuration of a display device 1B according to the second embodiment. A configuration of the light-emitting layer 80 and the bank 70 is mainly different between the display device 1B (see FIG. 11) and the display device 1 (see FIG. 1). The display device 1B has a configuration in which a bank 70A including a plurality of light-emitting layers (function layers) 80 being layered is provided instead of the bank 70 in the display device 1.

Adjacent first electrodes 31 are divided by the bank 70A in the display device 1B. Further, a circumferential end portion (edge) of each of the first electrodes 31 overlaps the bank 70A across the entire circumference. The bank 70A includes a light-emitting layer (first function layer) 80B overlapping the entire circumference of the circumferential end portion of the first electrode 31 via a first charge transport layer 46, a light-emitting layer (second function layer) 80G overlapping the light-emitting layer 80B, and a light-emitting layer (third function layer) 80R overlapping the light-emitting layer 80G.

Each of the light-emitting layers 80B, 80G, and 80R is a function layer containing a photosensitive material and a nanofiber.

For example, a first electrode (first pixel electrode) 31B overlaps the light-emitting layer (first function layer) 80B, the light-emitting layer (second function layer) 80G, and the light-emitting layer (third function layer) 80R across the entire circumference of the circumferential end portion via a first charge transport layer 46B. Further, a first electrode (second pixel electrode) 31G overlaps the light-emitting layer 80B, the light-emitting layer 80G, and the light-emitting layer 80R across the entire circumference of the circumferential end portion via a first charge transport layer 46G. Further, a first electrode (third pixel electrode) 31R overlaps the light-emitting layer 80B, the light-emitting layer 80G, and the light-emitting layer 80R across the entire circumference of the circumferential end portion via a first charge transport layer 46R.

In this way, the circumferential end portion of each of the first electrodes 31B, 31G, and 31R is layered by the plurality of light-emitting layers 80. Thus, a distance between the circumferential end portion of each of the first electrodes 31B, 31G, and 31R, and a second electrode 32 can be set greater than a distance between a central portion (a region surrounded by the circumferential end portion) of each of the first electrodes 31B, 31G, and 31R, and the second electrode 32. In this way, occurrence of electrolytic concentration between the circumferential end portion of each of the first electrodes 31B, 31G, and 31R, and the second electrode 32 can be suppressed. Thus, degradation of each of the first electrodes 31B, 31G, and 31R caused by the electrolytic concentration can be suppressed.

Note that the circumferential end portion of each of the first electrodes 31B, 31G, and 31R may not be layered by the plurality of light-emitting layers 80 across the entire circumference, and at least a part of the end portion may be layered by the plurality of light-emitting layers 80. Further, the bank 70A is not limited to a triple-layer structure of the light-emitting layers 80B, 80G, and 80R, and may have a structure in which any two layers of the light-emitting layers 80B, 80G, and 80R are layered. Further, when the first charge transport layer 46 is a function layer containing a photosensitive material and a nanofiber, the bank 70A may have a configuration in which two layers or three layers among the first charge transport layer (first function layer) 46B, the first charge transport layer (second function layer) 46G, and the first charge transport layer (third function layer) 46R that are function layers are layered instead of the light-emitting layers 80B, 80G, and 80R. Further, when a second charge transport layer 47 is a function layer containing a photosensitive resin and a nanofiber, the bank 70A may have a configuration in which two layers or three layers among a second charge transport layer (first function layer) 47B, a second charge transport layer (second function layer) 47G, and a second charge transport layer (third function layer) 47R that are function layers are layered instead of the light-emitting layers 80B, 80G, and 80R.

A layering order of a plurality of layers constituting the bank 70A is preferably an order of a layer having a smaller diameter of contained fine particles (quantum dots or nanoparticles) to a layer having a larger diameter of the fine particles from a lower layer to an upper layer. The fine particles having a smaller diameter has a smaller gap therebetween than the fine particles having a larger diameter. Thus, the fine particle having a larger diameter fit between the fine particles having a smaller diameter is suppressed, and a total thickness (i.e., a height of the bank 70A) of the plurality of layers is readily set thicker. For example, the total thickness (i.e., the height of the bank 70A) of the light-emitting layers 80B, 80G, and 80R is readily set thicker by setting, as a lower layer, the light-emitting layer 80B having the smallest diameter of the quantum dots among the light-emitting layers 80B, 80G, and 80R, and layering, on the light-emitting layer 80G, the light-emitting layer 80R having a larger particle size of the quantum dots than the light-emitting layer 80B.

Figure 12:
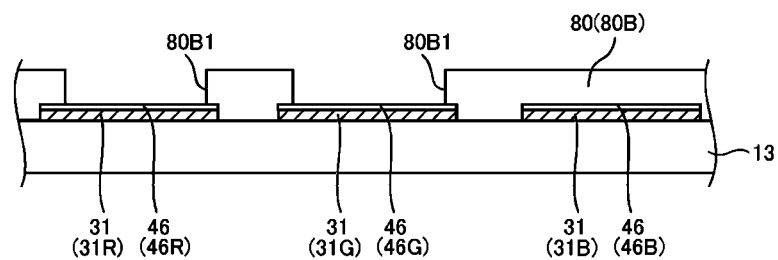
FIG. 12 is a cross-sectional view of a substrate on which a light-emitting layer is patterned according to the second embodiment.
Figure 13:
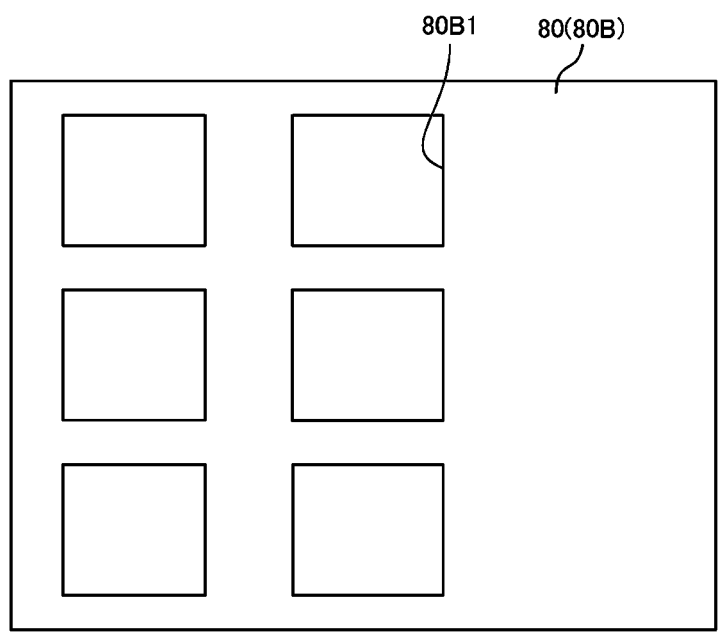
FIG. 13 is a plan view of the substrate illustrated in FIG. 12.
Figure 14:
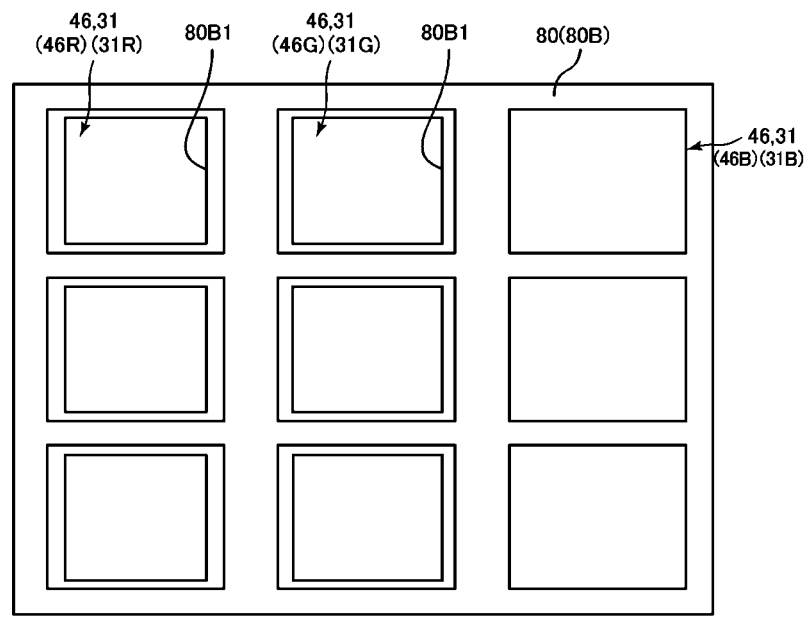
FIG. 14 is a plan view illustrating the light-emitting layer illustrated in FIGS. 12 and 13.

FIG. 12 is a cross-sectional view of a substrate on which the light-emitting layer 80B is patterned according to the second embodiment. FIG. 13 is a plan view of the substrate illustrated in FIG. 12. FIG. 14 is a plan view illustrating the light-emitting layer 80B illustrated in FIGS. 12 and 13.

In a manufacturing method for the display device 1B according to the present embodiment, when the bank 70A is formed of the light-emitting layers 80B, 80G, and 80R, the first electrode 31 is formed through steps S1 to S3 illustrated in FIG. 2, the step (step S4) of forming the bank 70 is then omitted, and the first charge transport layer 46 is formed (step S5). Next, the light-emitting layer 80 is formed (step S6). For example, first, the light-emitting layer 80B is formed in the step of forming the light-emitting layer 80 (step S6). Subsequently, the light-emitting layer 80G is formed, and next, the light-emitting layer 80R is formed.

As illustrated in FIG. 12, a colloidal solution to become the light-emitting layer 80B is applied, by an applying method such as a slit coating method, to the entire surface of the substrate 13 on which the first electrodes 31B, 31G, and 31R, and the first charge transport layers 46B, 46G, and 46R are patterned. Subsequently, the light-emitting layer 80B is formed, through prebaking, exposure, and development, on an upper layer of the substrate 13 on which the first electrodes 31B, 31G, and 31R, and the first charge transport layers 46B, 46G, and 46R are patterned.

In the present embodiment, as illustrated in FIGS. 12 to 14, the light-emitting layer 80B has an opening 80B1 is formed so as to expose a central portion in a region surrounded by a circumferential end portion of each of the first charge transport layers 46R and 46G, and the light-emitting layer 80B is patterned so as to cover the circumferential end portion of each of the first charge transport layers 46R and 46G, the first charge transport layer 46B, and a portion between the first charge transport layers 46.

Subsequently, the light-emitting layer 80G is formed so as to overlap each of the inside of the opening 80B1 overlapping the first charge transport layer 46G, the circumferential end portion of each of the first charge transport layers 46R and 46G, the first charge transport layer 46B, and the portion between the first charge transport layers 46. Then, the light-emitting layer 80R is formed so as to overlap each of the inside of the opening 80B1 overlapping the first charge transport layer 46R, the circumferential end portion of each of the first charge transport layers 46R and 46G, the first charge transport layer 46B, and the portion between the first charge transport layers 46. In this way, for example, the light-emitting layers 80B, 80G, and 80R are function layers containing the nanofiber and the photosensitive material, and can thus be formed with suppressed unevenness in film thickness by using an applying method, such as a slit coating method, exposure, and development.

Third Embodiment

Next, a third embodiment will be described. Note that a difference from the first embodiment and the second embodiment will be mainly described, and a description of contents overlapping the first embodiment and the second embodiment will be omitted.

Figure 15:
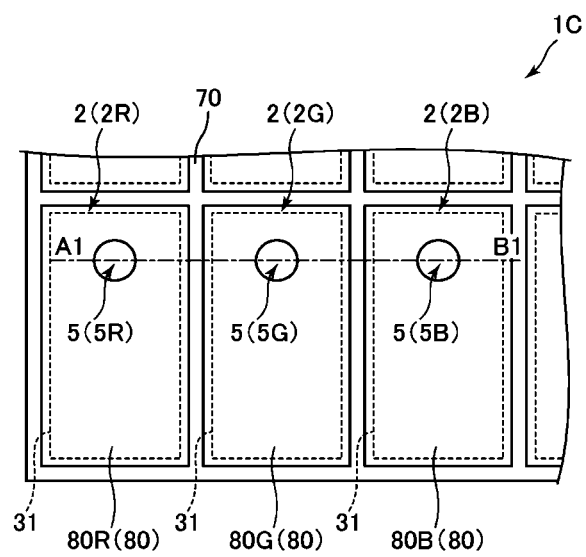
FIG. 15 is a plan view illustrating a general configuration of a display device according to a third embodiment.
Figure 16:
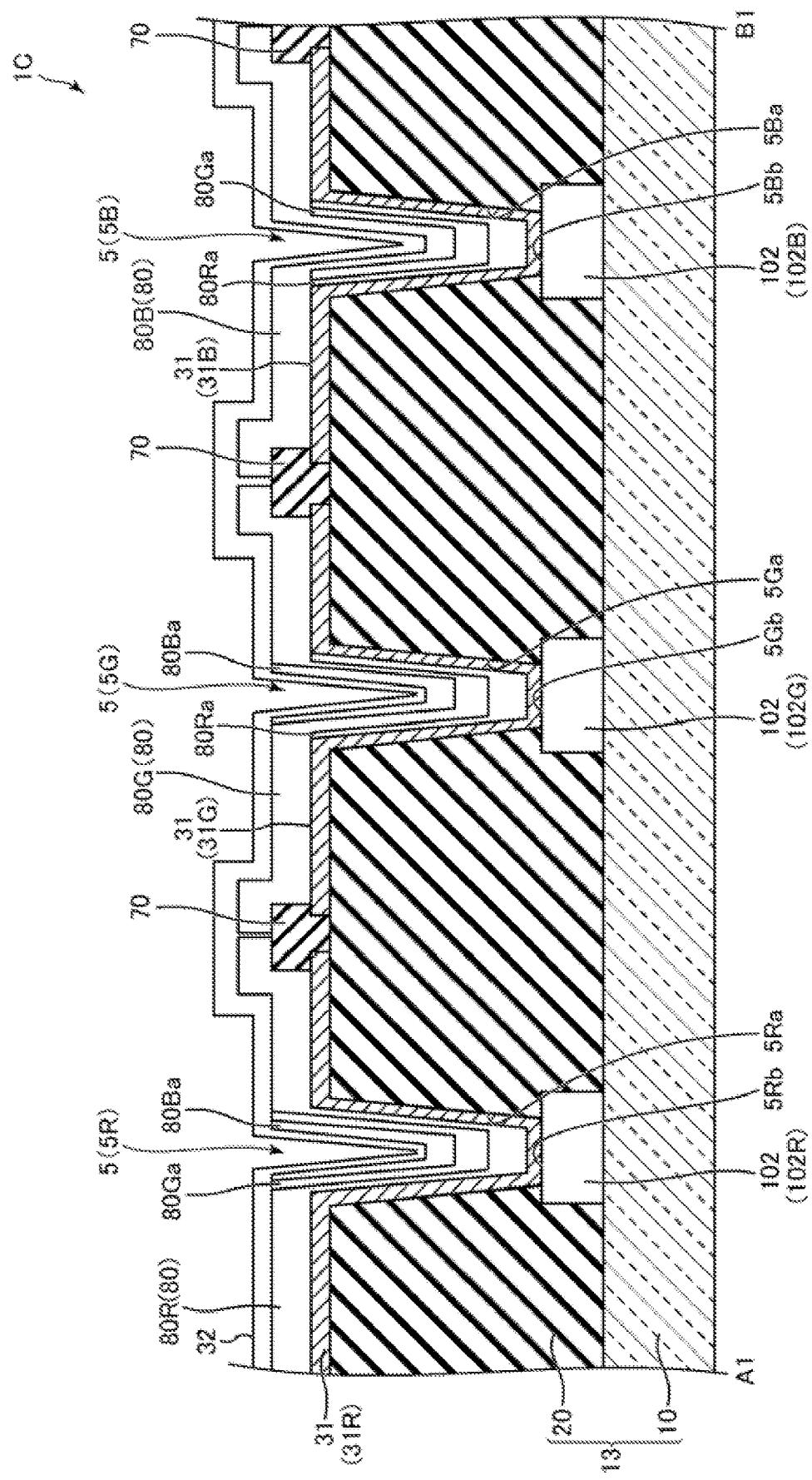
FIG. 16 is a cross-sectional view taken along a line A1-B1 in FIG. 15.

FIG. 15 is a plan view illustrating a general configuration of a display device 1C according to the third embodiment. FIG. 16 is a cross-sectional view taken along a line A1-B1 in FIG. 15. The display device 1C (see FIG. 16) mainly differs from the display device 1 (see FIG. 1) in a point that a plurality of light-emitting layers 80 are layered on a contact hole formed in the light-emitting layer 80. Note that description of a first charge transport layer 46 and a second charge transport layer 47 will be omitted from FIG. 16.

In the present embodiment, light-emitting layers 80B, 80G, and 80R are assumed to be function layers containing a nanofiber and a photosensitive material.

As illustrated in FIGS. 15 and 16, a contact hole 5 (contact holes 5B, 5G, and 5R) including an inclined face and a bottom face is formed in a light-emitting region of each pixel 2 in the display device 1C. In other words, the contact hole 5B including an inclined face 5Ba and a bottom face 5Bb is formed in an interlayer insulating film 20 in a blue pixel 2B. A first TFT 102B provided on a lower layer of the interlayer insulating film 20 and a first electrode 31B provided on an upper layer of the interlayer insulating film 20 are connected through the contact hole 5B directly or via a wiring line. Further, the contact hole 5G including an inclined face 5Ga and a bottom face 5Gb is formed in the interlayer insulating film 20 in a green pixel 2G. A second TFT 102G formed on the lower layer of the interlayer insulating film 20 and a first electrode 31G formed on the upper layer of the interlayer insulating film 20 are connected through the contact hole 5G directly or via a wiring line. Further, the contact hole 5R including an inclined face 5Ra and a bottom face 5Rb is formed in the interlayer insulating film 20 in a red pixel 2R. A third TFT 102R formed on the lower layer of the interlayer insulating film 20 and a first electrode 31R formed on the upper layer of the interlayer insulating film 20 are connected through the contact hole 5R directly or via a wiring line.

The first TFT 102B is a TFT that controls light emission of the blue pixel 2B, the second TFT 102G is a TFT that controls light emission of the green pixel 2G, and the third TFT 102R is a TFT that controls light emission of the red pixel 2R.

Further, a light-emitting layer that emits light of a different color is layered on a first electrode 31 in the contact hole 5. In this way, a step of the contact hole 5 can be reduced.

A light-emitting layer 80Ra is a layer separated from the light-emitting layer 80R, and is formed by the same material and the same step as the light-emitting layer 80R. A light-emitting layer 80Ga is a layer separated from the light-emitting layer 80G, and is formed by the same material and the same step as the light-emitting layer 80G. A light-emitting layer 80Ba is a layer separated from the light-emitting layer 80B, and is formed by the same material and the same step as the light-emitting layer 80B.

For example, in the contact hole 5R, the light-emitting layer 80R is layered on the first electrode 31R, the light-emitting layer 80Ga separated from the light-emitting layer 80G is further layered, and the light-emitting layer 80Ba separated from the light-emitting layer 80B is further layered. Further, in the contact hole 5G, the light-emitting layer 80Ra separated from the light-emitting layer 80R is layered on the first electrode 31G, the light-emitting layer 80G is further layered, and the light-emitting layer 80Ba separated from the light-emitting layer 80B is further layered. Further, in the contact hole 5B, the light-emitting layer 80Ra separated from the light-emitting layer 80R is layered on the first electrode 31B, the light-emitting layer 80Ga separated from the light-emitting layer 80G is further layered, and the light-emitting layer 80B is further layered.

For example, the light-emitting layers 80B, 80Ba, 80G, 80Ga, 80R, and 80Ra are function layers containing the nanofiber and the photosensitive material, and can thus be formed with suppressed unevenness in film thickness by using an applying method, such as a slit coating method, exposure, and development.

In the light-emitting layer layered on the bottom face of the contact hole 5, a thickness of the light-emitting layer formed on the lowest layer is the thickest, and the thickness of the light-emitting layer 80 becomes thinner toward the upper layer.

Here, the first electrode 31 is patterned by, for example, vapor deposition or sputtering. On the other hand, the light-emitting layer 80 is patterned by using an applying method, exposure, and development. Thus, a standard deviation of a maximum value for each contact hole 5 of a thickness of the light-emitting layer layered on the inclined face in the contact hole 5 and a thickness of the light-emitting layer layered on the bottom face in the contact hole 5 is greater than a standard deviation of a maximum value for each contact hole 5 of a thickness of the first electrode 31 on the inclined face in the contact hole 5 and a thickness of the first electrode 31 on the bottom face in the contact hole 5.

Here, the light-emitting layers 80Ba, 80Ga, and 80Ra that emit light of different colors are provided in the contact hole 5, and thus external light having a wavelength shorter than a light-emitting wavelength emitted by each of the light-emitting layers 80Ba, 80Ga, and 80Ra can be absorbed. Thus, a layering order of the plurality of light-emitting layers layered in the contact hole 5 is preferably an order in which the light-emitting layer having a longer light-emitting wavelength is provided on a side closer to the first electrode 31 (lower-layer side), and the light-emitting layer having a shorter light-emitting wavelength is provided on a side closer to the second electrode 32 (upper-layer side). For example, of the light-emitting layers layered in the contact hole 5, the light-emitting layers 80R and 80Ra having a longer light-emitting wavelength are preferably provided on the side closer to the first electrode 31 (lower-layer side), and the light-emitting layers 80B and 80Ba having a shorter light-emitting wavelength are preferably provided on the side closer to the second electrode 32 (upper-layer side). In this way, external light around the contact hole 5 and having a wavelength in a broader range shorter than the light-emitting wavelength of the light-emitting layers 80R and 80Ra whose light-emitting wavelength is long can be readily absorbed. As a result, reflection of the external light around the contact hole 5 can be more effectively suppressed.

The light-emitting layer 80Ra, the light-emitting layer 80Ga, and the light-emitting layer 80B are preferably layered (overlapped) from the lower layer to the upper layer in this order on the first electrode 31 on at least the inclined face 5Ba of the inclined face 5Ba and the bottom face 5Bb in the contact hole 5B. In this way, even when a film thickness of any of the light-emitting layer 80Ra, the light-emitting layer 80Ga, and the light-emitting layer 80B is formed to be thin due to an inclination of the inclined face 5Ba in the contact hole 5B, a thickness can be ensured as the plurality of layered light-emitting layers as a whole. In this way, electrolytic concentration in the circumferential end portion of the first electrode 31B in the contact hole 5B can be suppressed. Note that at least a plurality of light-emitting layers that emit light of different colors may be layered (overlapped) on the inclined face 5Ba in the contact hole 5B.

The light-emitting layer 80Ra, the light-emitting layer 80G, and the light-emitting layer 80Ba are preferably layered (overlapped) from the lower layer to the upper layer in this order on the first electrode 31 on at least the inclined face 5Ga of the inclined face 5Ga and the bottom face 5Gb in the contact hole 5G. In this way, even when a film thickness of any of the light-emitting layer 80Ra, the light-emitting layer 80G, and the light-emitting layer 80Ba is formed to be thin due to an inclination of the inclined face 5Ga in the contact hole 5G, the thickness can be ensured as the plurality of layered light-emitting layers as a whole. In this way, electrolytic concentration in the circumferential end portion of the first electrode 31G in the contact hole 5G can be suppressed. Note that at least a plurality of light-emitting layers (the light-emitting layer 80G, and the light-emitting layer 80Ba or the light-emitting layer 80Ra) that emit light of different colors may be layered (overlapped) on the inclined face 5Ga in the contact hole 5G.

The light-emitting layer 80R, the light-emitting layer 80Ga, and the light-emitting layer 80Ba are preferably layered (overlapped) from the lower layer to the upper layer in this order on the first electrode 31 on at least the inclined face 5Ra of the inclined face 5Ra and the bottom face 5Rb in the contact hole 5R. In this way, even when a film thickness of any of the light-emitting layer 80R, the light-emitting layer 80Ga, and the light-emitting layer 80Ba is formed to be thin due to an inclination of the inclined face 5Ra in the contact hole 5R, the thickness can be ensured as the plurality of layered light-emitting layers as a whole. In this way, electrolytic concentration in the circumferential end portion of the first electrode 31R in the contact hole 5R can be suppressed. Note that at least a plurality of light-emitting layers (the light-emitting layer 80R, and the light-emitting layer 80Ba or the light-emitting layer 80Ga) that emit light of different colors may be layered (overlapped) on the inclined face 5Ra in the contact hole 5R.

Note that, in addition to or instead of the light-emitting layers 80B, 80Ba, 80G, 80Ga, 80R, and 80Ra, at least either first charge transport layers 46B, 46G, and 46R or second charge transport layers 47B, 47G, and 47R may contain a nanofiber and a photosensitive material, be patterned by using application and photolithography, and thus be layered (overlapped) in the contact hole 5 similarly to the light-emitting layers 80B, 80Ba, 80G, 80Ga, 80R, and 80Ra described above.

Fourth Embodiment

Next, a fourth embodiment will be described. Note that a difference from the first embodiment to the third embodiment will be mainly described, and a description of contents overlapping the first embodiment to the third embodiment will be omitted.

Figure 17:
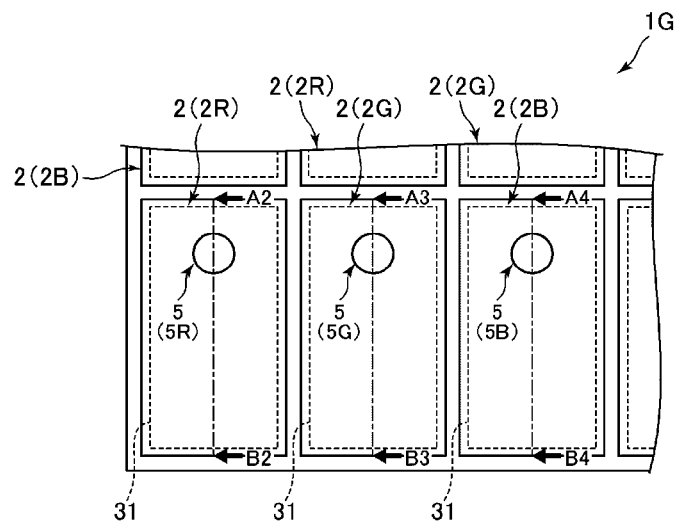
FIG. 17 is a plan view illustrating a general configuration of a display device according to a fourth embodiment.
Figure 18A:
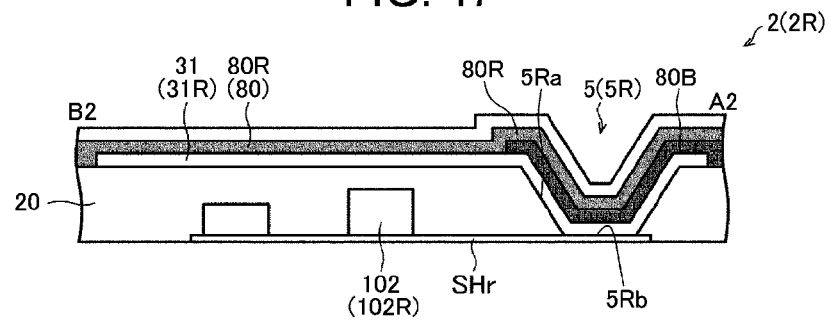
FIG. 18A is a cross-sectional view taken along a line A2-B2 in FIG. 17.
Figure 18B:
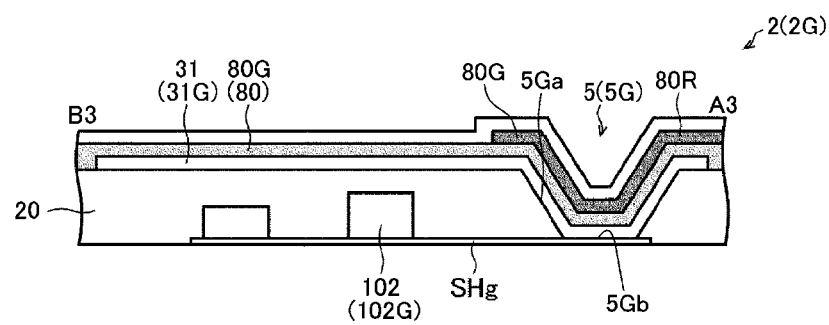
FIG. 18B is a cross-sectional view taken along a line A3-B3 in FIG. 17.
Figure 18C:
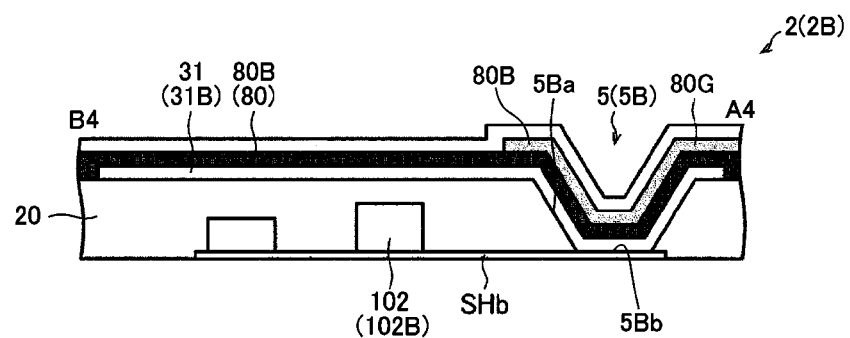
FIG. 18C is a cross-sectional view taken along a line A4-B4 in FIG. 17.

FIG. 17 is a plan view illustrating a general configuration of a display device 1G according to the fourth embodiment. FIG. 18A is a cross-sectional view taken along a line A2-B2 in FIG. 17. FIG. 18B is a cross-sectional view taken along a line A3-B3 in FIG. 17. FIG. 18C is a cross-sectional view taken along a line A4-B4 in FIG. 17.

The display device 1G (see FIG. 17) has a configuration in which the bank 70 is mainly omitted from the display device 1C (see FIG. 16), and a plurality of light-emitting layers are layered on a part of an edge (circumferential end portion) of a first electrode 31. Note that description of a first charge transport layer 46, a second charge transport layer 47, and an array substrate 10 will be omitted from FIGS. 18A to 18C.

In the present embodiment, light-emitting layers 80B, 80G, and 80R are assumed to be function layers containing a nanofiber and a photosensitive material.

As illustrated in FIGS. 17 and 18A to 18C, a contact hole 5 (contact holes 5R, 5G, and 5B) is formed in a light-emitting region of each pixel 2 in the display device 1G.

In other words, as illustrated in FIG. 18A, the contact hole 5R including an inclined face 5Ra and a bottom face 5Rb is formed in an interlayer insulating film 20 in a red pixel 2R. A first electrode 31R formed on an upper layer of the interlayer insulating film 20 is connected, through the contact hole 5R, to an in-pixel wiring line (wiring line) SHr formed on a lower layer of the interlayer insulating film 20. Further, the in-pixel wiring line SHr is connected to a third TFT 102R (TFT 102) formed on the lower layer of the interlayer insulating film 20. Further, as illustrated in FIG. 18B, the contact hole 5G including an inclined face 5Ga and a bottom face 5Gb is formed in the interlayer insulating film 20 in a green pixel 2G. A first electrode 31G formed on the upper layer of the interlayer insulating film 20 is connected, through the contact hole 5G, to an in-pixel wiring line (wiring line) SHg formed on the lower layer of the interlayer insulating film 20. Further, the in-pixel wiring line SHg is connected to a second TFT 102G (TFT 102) formed on the lower layer of the interlayer insulating film 20. Further, as illustrated in FIG. 18C, the contact hole 5B including an inclined face 5Ba and a bottom face 5Bb is formed in the interlayer insulating film 20 in a blue pixel 2B. A first electrode 31B formed on the upper layer of the interlayer insulating film 20 is connected, through the contact hole 5B, to an in-pixel wiring line (wiring line) SHb formed on the lower layer of the interlayer insulating film 20. Further, the in-pixel wiring line SHb is connected to a first TFT 102B (TFT 102) formed on the lower layer of the interlayer insulating film 20.

In the present embodiment, for example, in the contact hole 5, two layers having different luminescent colors among the light-emitting layer 80R, the light-emitting layer 80G, and the light-emitting layer 80B are layered on the first electrode 31, and two layers having different luminescent colors among the light-emitting layer 80R, the light-emitting layer 80G, and the light-emitting layer 80B are also layered on a part of the edge of the first electrode 31.

For example, as illustrated in FIG. 18A, in the contact hole 5R in the red pixel 2R, the light-emitting layer 80B of the blue pixel 2B adjacent to the red pixel 2R is layered on the first electrode 31R, and the light-emitting layer 80R is layered (overlapped) on the light-emitting layer 80B. Then, an edge of the first electrode 31R is covered with the light-emitting layer 80R, and a part of the edge of the first electrode 31R (edge of the first electrode 31R adjacent to the first electrode 31B) is covered with the light-emitting layer 80B and the light-emitting layer 80R. Note that two layers of the light-emitting layers 80B and 80R may be layered (overlapped) on at least the inclined face 5Ra in the contact hole 5R. Further, for example, as illustrated in FIG. 18B, in the contact hole 5G in the green pixel 2G, the light-emitting layer 80G is layered on the first electrode 31G, and the light-emitting layer 80R of the red pixel 2R adjacent to the green pixel 2G is layered (overlapped) on the light-emitting layer 80G. Then, an edge of the first electrode 31G is covered with the light-emitting layer 80G, and a part of the edge of the first electrode 31G (edge of the first electrode 31G adjacent to the first electrode 31R) is covered with the light-emitting layer 80G and the light-emitting layer 80R. Note that two layers of the light-emitting layers 80G and 80R may be layered (overlapped) on at least the inclined face 5Ga in the contact hole 5G. Further, for example, as illustrated in FIG. 18C, in the contact hole 5B in the blue pixel 2B, the light-emitting layer 80B is layered on the first electrode 31B, and the light-emitting layer 80G of the green pixel 2G adjacent to the blue pixel 2B is layered (overlapped) on the light-emitting layer 80B. Then, an edge of the first electrode 31B is covered with the light-emitting layer 80B, and a part of the edge of the first electrode 31B (edge of the first electrode 31B adjacent to the first electrode 31G) is covered with the light-emitting layer 80B and the light-emitting layer 80G. Note that two layers of the light-emitting layers 80B and 80G may be layered (overlapped) on at least the inclined face 5Ba in the contact hole 5B.

In this way, the light-emitting layers 80B, 80G, and 80R contain the nanofiber and the photosensitive material in the display device 1G. Thus, each of the light-emitting layers 80B, 80G, and 80R can be patterned by using application and photolithography such that the light-emitting layers having different luminescent colors are layered over the contact hole 5. Note that, in addition to or instead of the light-emitting layers 80B, 80G, and 80R, at least either first charge transport layers 46B, 46G, and 46R or second charge transport layers 47B, 47G, and 47R may contain a nanofiber and a photosensitive material, be patterned by using application and photolithography, and thus be layered (overlapped) in the contact hole 5 similarly to the light-emitting layers 80B, 80G, and 80R described above.

Fifth Embodiment

Next, a fifth embodiment will be described. Note that a difference from the first embodiment to the fourth embodiment will be mainly described, and a description of contents overlapping the first embodiment to the fourth embodiment will be omitted.

Figure 19:
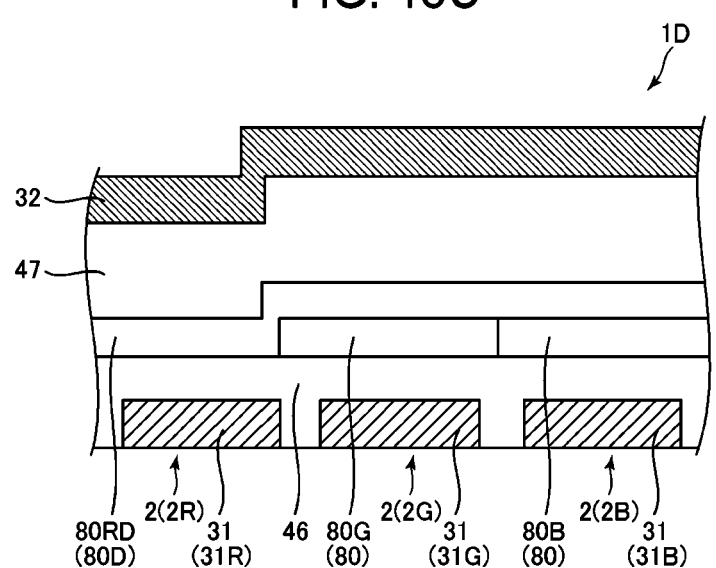
FIG. 19 is a cross-sectional view illustrating a general configuration of a display device according to a fifth embodiment.
Figure 20:
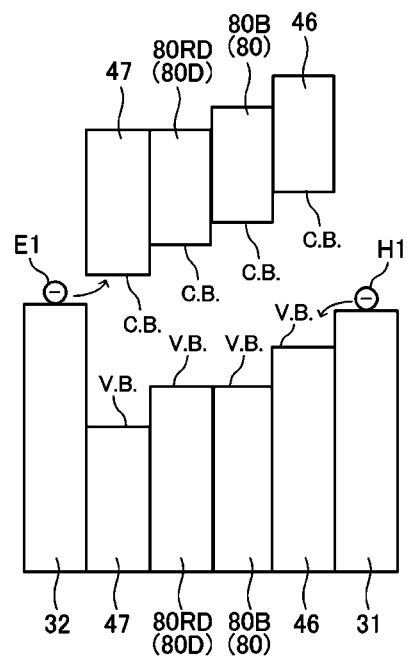
FIG. 20 is a diagram illustrating energy level of a light-emitting element in the display device according to the fifth embodiment.

FIG. 19 is a cross-sectional view illustrating a general configuration of a display device 1D according to the fifth embodiment. FIG. 20 is a diagram illustrating energy level of a light-emitting element in the display device 1D according to the fifth embodiment. Note that illustration of a bank 70 is omitted from FIG. 19. Alternatively, the display device 1D may have a configuration from which the bank 70 is omitted.

As illustrated in FIG. 19, the display device 1D mainly differs from the display device 1 (see FIG. 1) in a point that a first charge transport layer (common layer) 46, a light-emitting layer (common layer) 80RD provided in a red pixel 2R, and a second charge transport layer (common layer) 47 are formed in common across each pixel 2.

In the display device 1D, each of light-emitting layers 80B and 80G among the light-emitting layers 80B, 80G, and 80RD is a function layer containing a nanofiber and a photosensitive material, and is patterned by using application and photolithography for each pixel 2 (for each blue pixel 2B in the light-emitting layer 80B and each green pixel 2G in the light-emitting layer 80G).

On the other hand, the light-emitting layer 80RD among the light-emitting layers 80B, 80G, and 80RD, the first charge transport layer 46, and the second charge transport layer 47 do not contain at least one of the nanofiber and the photosensitive material, are not the function layers, and are not thus patterned by using application and photolithography.

The first charge transport layer 46 covers first electrodes 31B, 31G, and 31R, and is provided in common across each blue pixel 2B, each green pixel 2G, and each red pixel 2R. The light-emitting layer 80RD is layered on an upper layer of the first electrode 31R in the red pixel 2R, is layered on an upper layer of the light-emitting layer 80G in the green pixel 2G, and is layered on an upper layer of the light-emitting layer 80B in the blue pixel 2B, and is further provided in common across each blue pixel 2B, each green pixel 2G, and each red pixel 2R. The second charge transport layer 47 is layered on the light-emitting layer 80RD, and is provided in common across each blue pixel 2B, each green pixel 2G, and each red pixel 2R. The light-emitting layer 80RD has an energy level of lowest unoccupied molecular orbital (LUMO) lower than that of the light-emitting layers 80B and 80G.

As illustrated in FIG. 20, a difference in energy level of a valence band (V.B.) between quantum dots depending on a diameter of the quantum dots (i.e., luminescent colors) is small. Thus, injection efficiency of a positive hole H1 from the first charge transport layer 46 (hole transport layer (HTL)) to the light-emitting layer 80B, and injection efficiency of the positive hole H1 from the first charge transport layer 46 (hole transport layer (HTL)) to the light-emitting layer 80RD are almost the same.

On the other hand, a difference in energy level of a conduction band (C.B.) between quantum dots is great depending on a diameter of the quantum dots (i.e., luminescent colors). Thus, injection efficiency of an electron E1 from the second charge transport layer 47 (electron transport layer (ETL)) to the light-emitting layer 80B is inferior to injection efficiency of the electron E1 from the second charge transport layer 47 (electron transport layer (ETL)) to the light-emitting layer 80RD.

Thus, as described above, by providing the light-emitting layer 80RD between the second charge transport layer 47 and the light-emitting layer 80B, a barrier to the electron E1 between layers can be reduced, and the injection efficiency of the electron E1 from the second charge transport layer 47 to the light-emitting layer 80B can be increased.

Figure 21:
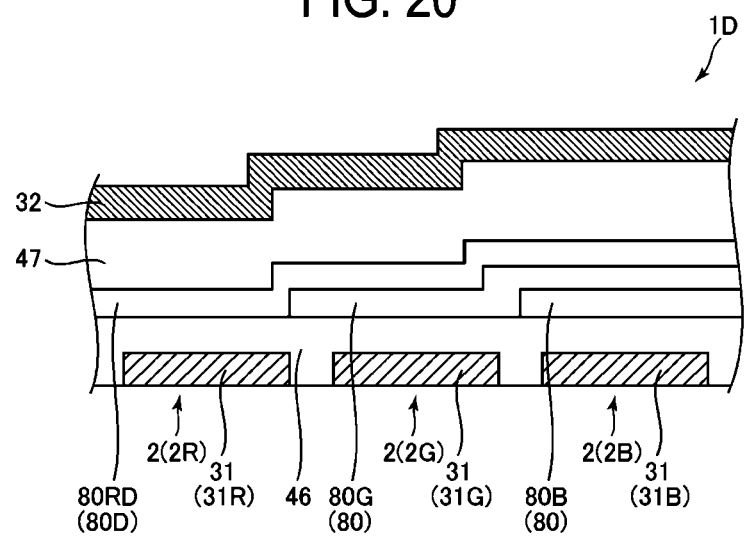
FIG. 21 is a cross-sectional view illustrating a general configuration of a display device according to a first modified example of the fifth embodiment.

FIG. 21 is a cross-sectional view illustrating a general configuration of a display device 1D according to a first modified example of the fifth embodiment. Note that illustration of the bank 70 is omitted from FIG. 21. Alternatively, the display device 1D illustrated in FIG. 21 may have a configuration from which the bank 70 is omitted. The display device 1D illustrated in FIG. 21 differs from the display device 1D illustrated in FIG. 19 in a point that the light-emitting layer 80G provided in the green pixel 2G is formed in common across the green pixel 2G and the blue pixel 2B.

In the display device 1D illustrated in FIG. 21, each of the light-emitting layers 80B and 80G among the light-emitting layers 80B, 80G, and 80RD is a function layer containing a nanofiber and a photosensitive material, and is patterned by using application and photolithography for each pixel 2 (for each blue pixel 2B in the light-emitting layer 80B and each green pixel 2G and each blue pixel 2B in the light-emitting layer 80G). On the other hand, the light-emitting layer 80RD among the light-emitting layers 80B, 80G, and 80RD, the first charge transport layer 46, and the second charge transport layer 47 do not contain at least one of the nanofiber and the photosensitive material, are not the function layers, and are not thus patterned by using application and photolithography.

Figure 22:
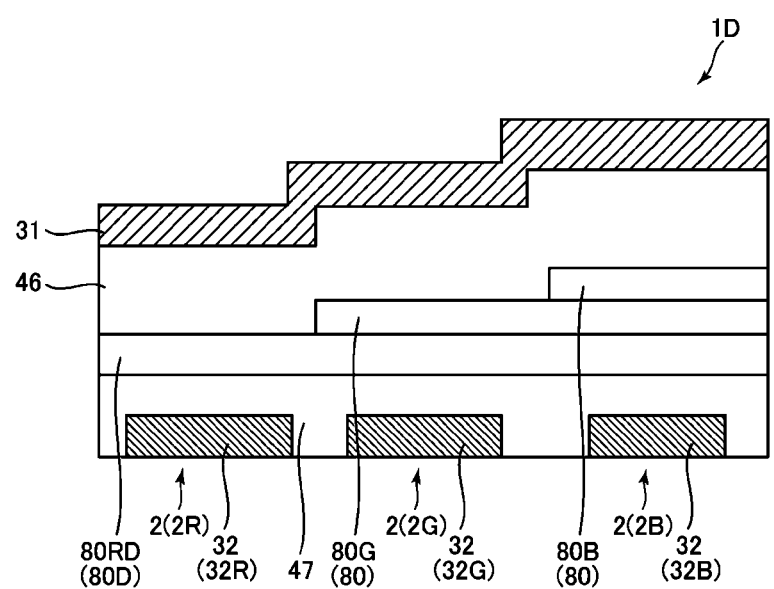
FIG. 22 is a cross-sectional view illustrating a general configuration of a display device according to a second modified example of the fifth embodiment.

FIG. 22 is a cross-sectional view illustrating a general configuration of a display device 1D according to a second modified example of the fifth embodiment. Note that illustration of the bank 70 is omitted from FIG. 22. Alternatively, the display device 1D illustrated in FIG. 22 may have a configuration from which the bank 70 is omitted. The display device 1D illustrated in FIG. 22 has a so-called invert structure in which a layering order of each layer from the first electrode 31 to the second electrode 32 in the display device 1D illustrated in FIG. 19 is inverted.

In the display device 1D illustrated in FIG. 22, a second electrode 32B is provided for each blue pixel 2B, a second electrode 32G is provided for each green pixel 2G, and a second electrode 32R is provided for each red pixel 2R on an upper layer of the interlayer insulating film 20 (not illustrated in FIG. 22). Further, the second charge transport layer 47 covering the second electrodes 32B, 32G, and 32R and being continuous across each pixel 2 is provided on the upper layer of the interlayer insulating film 20 (not illustrated in FIG. 22). Further, the light-emitting layer 80RD continuous across each pixel 2 is provided on an upper layer of the second charge transport layer 47. Further, the light-emitting layer 80G continuous across the green pixel 2G and the blue pixel 2B is provided on an upper layer of the light-emitting layer 80RD. Further, the light-emitting layer 80B is provided for each blue pixel 2B on an upper layer of the light-emitting layer 80G. Further, the first charge transport layer 46 continuous across each pixel 2 is provided on an upper layer of the light-emitting layers 80B, 80G, and 80R. Then, the first electrode 31 continuous across each pixel 2 is provided on an upper layer of the first charge transport layer 46.

Also in the display device 1D illustrated in FIG. 22, each of the light-emitting layers 80B and 80G among the light-emitting layers 80B, 80G, and 80RD is a function layer containing a nanofiber and a photosensitive material, and is patterned by using application and photolithography for each pixel 2 (for each blue pixel 2B in the light-emitting layer 80B and each green pixel 2G and each blue pixel 2B in the light-emitting layer 80G). On the other hand, the light-emitting layer 80RD among the light-emitting layers 80B, 80G, and 80RD, the first charge transport layer 46, and the second charge transport layer 47 do not contain at least one of the nanofiber and the photosensitive material, are not the function layers, and are not thus patterned by using application and photolithography.

Sixth Embodiment

Next, a sixth embodiment will be described. Note that a difference from the first embodiment to the fifth embodiment will be mainly described, and a description of contents overlapping the first embodiment to the fifth embodiment will be omitted. Note that a configuration of a first charge transport layer 46 is different between the first embodiment and the sixth embodiment.

Figure 23:
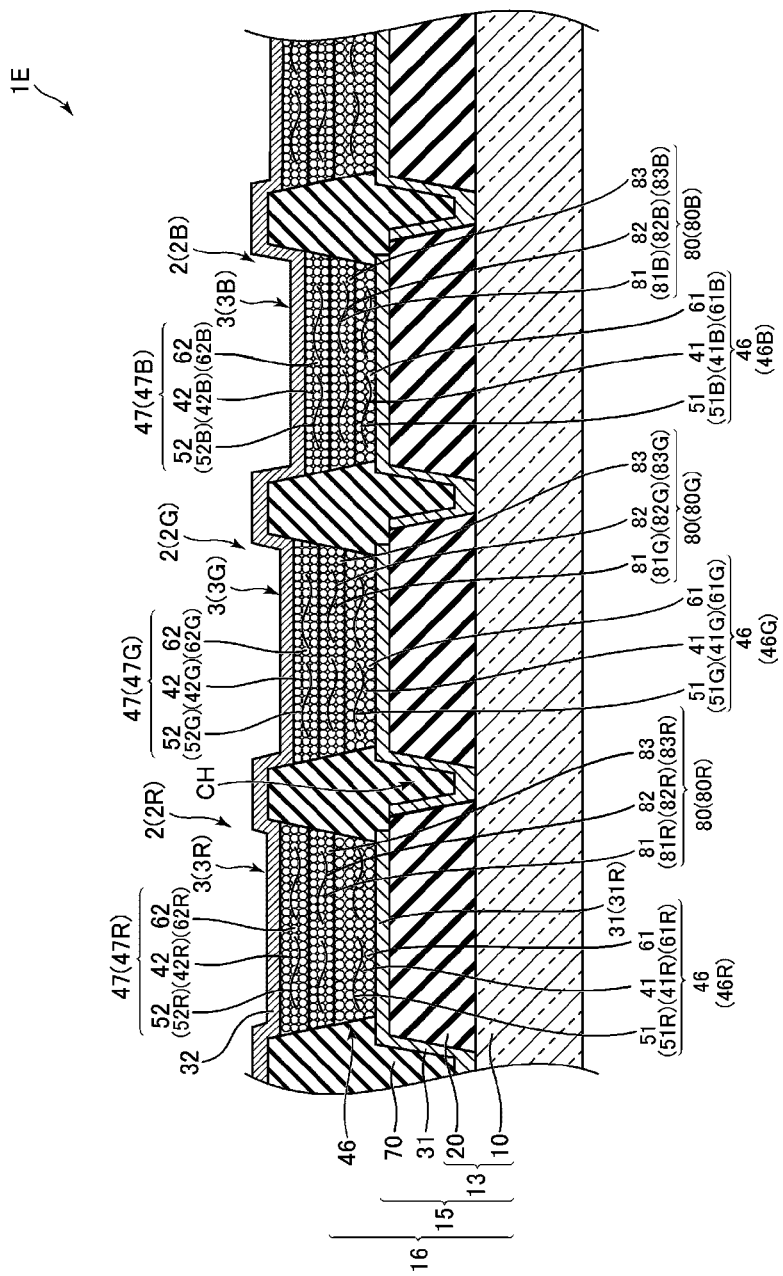
FIG. 23 is a cross-sectional view illustrating a general configuration of a display device according to a sixth embodiment.

FIG. 23 is a cross-sectional view illustrating a general configuration of a display device 1E according to the present embodiment. In the display device 1E according to the present embodiment, a film thickness of the first charge transport layer 46 is different in a light-emitting element 3B, a light-emitting element 3G, and a light-emitting element 3R. Specifically, as illustrated in FIG. 23, the film thickness of the first charge transport layer 46 included in the light-emitting element 3R is greater than the film thickness of the first charge transport layer 46 included in the light-emitting element 3G, and, furthermore, the film thickness of the first charge transport layer 46 included in the light-emitting element 3G is greater than the film thickness of the first charge transport layer 46 included in the light-emitting element 3B. More specifically, the film thickness of the first charge transport layer 46 included in the light-emitting element 3R is 150 nm. Further, the film thickness of the first charge transport layer 46 included in the light-emitting element 3G is 110 nm. Further, the film thickness of the first charge transport layer 46 included in the light-emitting element 3B is 40 nm. With such a configuration, extraction efficiency into a front direction is improved by an interference effect of light emitted from a light-emitting layer of each light-emitting element on a layer structure interface in the element. As a result, front brightness (the brightness of light extracted upward in FIG. 23) of the light-emitting device can be improved.

Seventh Embodiment

Next, a seventh embodiment will be described. Note that a difference from the above-described embodiment will be mainly described, and a description of contents overlapping the above-described embodiments will be omitted. Note that a configuration of a second charge transport layer 47 is different between the above-described embodiments and the seventh embodiment.

Figure 24:
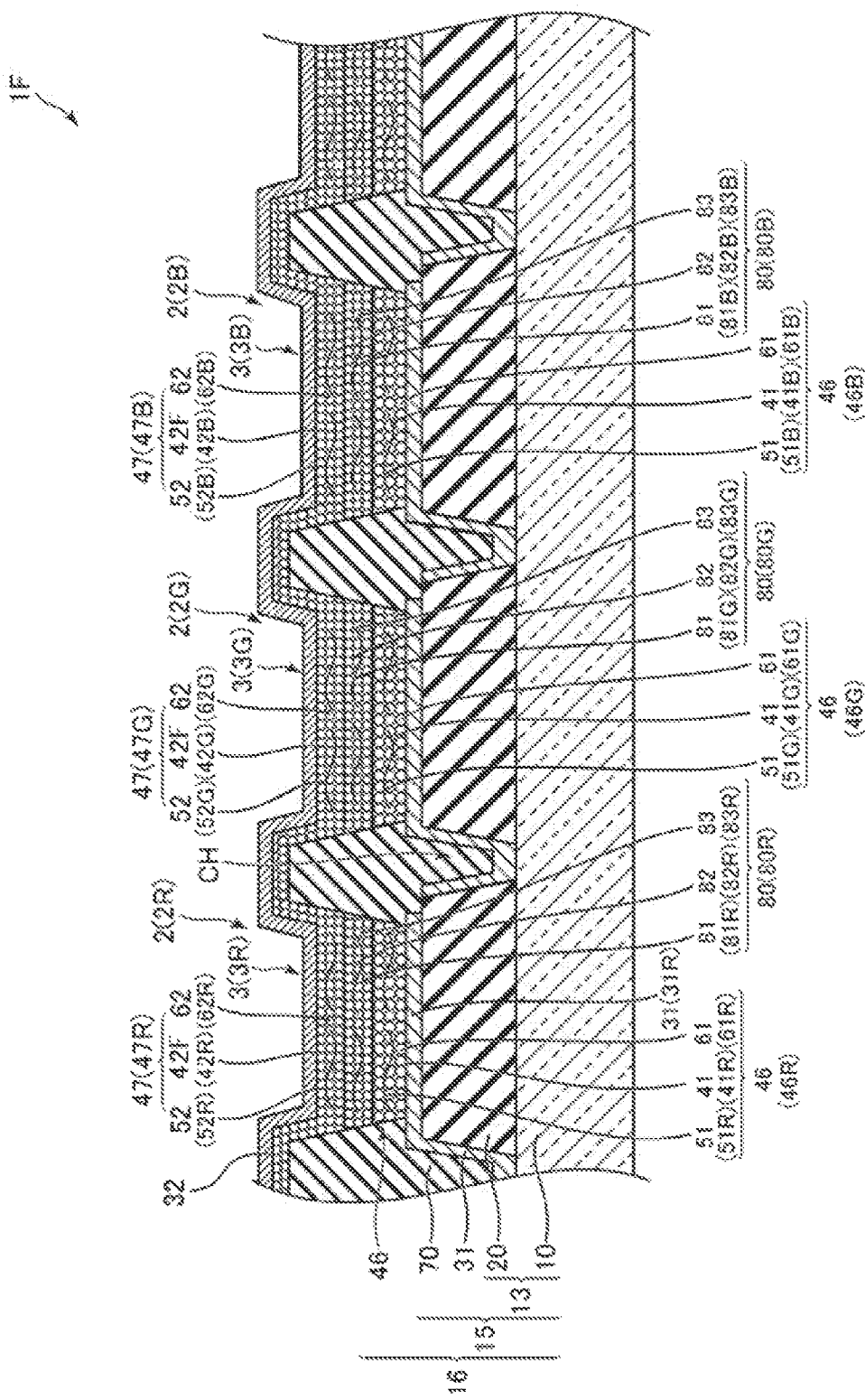
FIG. 24 is a cross-sectional view illustrating a general configuration of a display device according to a seventh embodiment.

FIG. 24 is a cross-sectional view illustrating a general configuration of a display device 1F according to the present embodiment. In the present embodiment, the second charge transport layer 47 includes a resin 42F, and a second charge transport material and a nanofiber 52 that are dispersed in the resin 42F. In other words, the second charge transport layer 47 may not include a photosensitive material.

Then, in the display device 1F according to the present embodiment, the second charge transport layer 47 is formed in common in a light-emitting element 3R, a light-emitting element 3G, and a light-emitting element 3B. Further, a second electrode 32 according to the present embodiment is a common electrode formed in common to the light-emitting elements 3. Specifically, as illustrated in FIG. 24, a first charge transport layer 46 according to the present embodiment is not formed in an island shape in a region divided by a bank 70, and is continuously formed so as to cover a light-emitting layer 80R, a light-emitting layer 80G, a light-emitting layer 80B, and the bank 70. With such a configuration, the second charge transport layer 47 does not need to be formed by separate patterning for each light-emitting layer 80 by photolithography, and can be collectively formed by, for example, a slit coating method. As a result, the light-emitting device can be readily manufactured.

Modified Example

A main embodiment according to the disclosure has been described above, but the disclosure is not limited to the above-described embodiments.

In the above-described embodiments, the light-emitting layer 80 includes the quantum dot. However, the light-emitting layer 80 according to an aspect of the disclosure may have a configuration without the quantum dot. In this case, the light-emitting layer 80 may be formed of, for example, an organic fluorescent material or a phosphorescent material.

Further, in the above-described embodiments, all of the first charge transport layer 46, the light-emitting layer 80, and the second charge transport layer 47 may not include the nanofiber and the photosensitive material, and at least any one layer may include the nanofiber and the photosensitive material. Even with such a configuration, patterning can be performed by application and photolithography, and occurrence of unevenness in film thickness can be suppressed in the display devices 1 to 1F.

Further, in the above-described embodiments, the first charge transport layer 46 includes the nanoparticle 61 that is a material having hole transport properties. However, the first charge transport layer 46 may not include the nanoparticle 61, and may include an organic material having the hole transport properties (for example, PEDOT: PSS, PVK, TFB, poly-TPD, or the like). Even with such a configuration, patterning can be performed by application and photolithography, and occurrence of unevenness in film thickness can be suppressed in the first charge transport layer 46.

Further, in the above-described embodiments, the second charge transport layer 47 includes the nanoparticle 62 that is a material having electron transport properties. However, the second charge transport layer 47 may not include the nanoparticle 62, and may include an organic material having the electron transport properties (for example, polyoxadiazole or a soluble $Alq_3$ polymer). Even with such a configuration, patterning can be performed by application and photolithography, and occurrence of unevenness in film thickness can be suppressed in the second charge transport layer 47.

Further, the elements described in the above-described embodiments and the modified examples may be appropriately combined in a range in which a contradiction does not arise.

The invention claimed is:

1. A display device comprising:
a first electrode;
a second electrode;
a light-emitting layer provided between the first electrode and the second electrode; and
a charge transport layer provided between the first electrode and the second electrode and containing a charge transport material configured to transport a charge to the light-emitting layer,
wherein at least one layer of the light-emitting layer and the charge transport layer is a function layer including a nanofiber and a photosensitive material.

2. The display device according to claim 1,
wherein the charge transport material is a nanoparticle.

3. The display device according to claim 2,
wherein the light-emitting layer includes a quantum dot.

4. The display device according to claim 3,
wherein a plurality of the quantum dots, a plurality of the nanoparticles, and a plurality of the nanofibers are included, and
a number of the quantum dots or the nanoparticles included in the function layer is greater than a number of the nanofibers.

5. The display device according to claim 1,
wherein the charge transport material is a nanoparticle,
the light-emitting layer includes a quantum dot, and
a diameter of the quantum dot or the nanoparticle included in the function layer is larger than a diameter of the nanofiber and smaller than a length of the nanofiber.

6. The display device according to claim 1,
wherein a length of the nanofiber is greater than or equal to twice a thickness of the function layer and less than or equal to 1 μm.

7. The display device according to claim 1,
wherein the nanofiber has insulating properties.

8. The display device according to claim 1,
wherein the nanofiber has optical transparency.

9. The display device according to claim 1,
wherein the nanofiber is a cellulose nanofiber.

10. The display device according to claim 1,
wherein the nanofiber is an oxidized cellulose nanofiber including a nitroxyl radical.

11. The display device according to claim 1, further comprising:
a first pixel configured to emit light of a first color;
a second pixel adjacent to the first pixel in a plan view and configured to emit light of a second color; and
a third pixel adjacent to the second pixel in the plan view and configured to emit light of a third color,
wherein the function layer includes
a first function layer provided in the first pixel, and
a second function layer provided in the second pixel, and
the first electrode includes
a first pixel electrode provided in the first pixel and overlapping the first function layer, and
a second pixel electrode provided in the second pixel and overlapping the second function layer.

12. The display device according to claim 11,
wherein the function layer further includes a third function layer provided in the third pixel, and
the first electrode further includes a third pixel electrode provided in the third pixel and overlapping the third function layer.

13. The display device according to claim 12,
wherein a circumferential end portion of the first pixel electrode overlaps the second function layer, and also overlaps the first function layer or the third function layer.

14. The display device according to claim 12,
wherein the circumferential end portion of the first pixel electrode overlaps the second function layer across an entire circumference, and also overlaps the first function layer or the third function layer.

15. The display device according to claim 12, further comprising
an interlayer insulating film provided on a lower layer of the first pixel electrode, the second pixel electrode, and the third pixel electrode, and provided in common across the first pixel, the second pixel, and the third pixel,
wherein the second pixel electrode is connected to a TFT or a wiring line provided on a lower layer of the interlayer insulating film through a contact hole formed in the interlayer insulating film, the contact hole including an inclined face, and
the inclined face overlaps the second function layer, and the first function layer or the third function layer.

16. The display device according to claim 11,
wherein the first electrode further includes a third pixel electrode provided in the third pixel, and
at least one layer of the light-emitting layer and the charge transport layer is provided in common across the first pixel, the second pixel, and the third pixel, and includes a common layer overlapping the first function layer and the second function layer.

17. The display device according to claim 16,
wherein the nanofiber includes a first nanofiber and a second nanofiber,
the photosensitive material includes a first photosensitive material and a second photosensitive material,
the first function layer includes the first nanofiber and the first photosensitive material,
the second function layer includes the second nanofiber and the second photosensitive material, and
the common layer does not include the photosensitive material.

18. The display device according to claim 17,
wherein the first nanofiber and the second nanofiber are equal in material.

19. The display device according to claim 17,
wherein the first nanofiber and the second nanofiber are equal in shape.

20. The display device according to claim 17,
wherein the function layer is the light-emitting layer,
the first function layer is a layer configured to emit the light of the first color,
the second function layer is a layer configured to emit the light of the second color, and
the common layer is a layer configured to emit the light of the third color, and has an energy level of LUMO lower than an energy level of LUMO of the first function layer and the second function layer.

* * * * *